United States Patent
Pendse

(10) Patent No.: US 11,251,154 B2
(45) Date of Patent: *Feb. 15, 2022

(54) THIN 3D FAN-OUT EMBEDDED WAFER LEVEL PACKAGE (EWLB) FOR APPLICATION PROCESSOR AND MEMORY INTEGRATION

(71) Applicant: STATS ChipPAC Pte. Ltd., Singapore (SG)

(72) Inventor: Rajendra D. Pendse, Fremont, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/878,345

(22) Filed: May 19, 2020

(65) Prior Publication Data

US 2020/0279827 A1 Sep. 3, 2020

Related U.S. Application Data

(63) Continuation of application No. 15/827,478, filed on Nov. 30, 2017, now Pat. No. 10,692,836, which is a
(Continued)

(51) Int. Cl.
*H01L 23/00* (2006.01)
*H01L 23/498* (2006.01)
(Continued)

(52) U.S. Cl.
CPC ............ *H01L 24/81* (2013.01); *H01L 21/561* (2013.01); *H01L 21/568* (2013.01);
(Continued)

(58) Field of Classification Search
None
See application file for complete search history.

(56) References Cited

U.S. PATENT DOCUMENTS 5,945,737 A * 8/1999 Cabral, Jr ............... H01L 24/10
257/747
5,976,710 A * 11/1999 Sachdev ........... H01L 23/49894
257/40
(Continued)

FOREIGN PATENT DOCUMENTS

CN 102136433 A 7/2011
JP 2004039863 A 2/2004
(Continued)

*Primary Examiner* — Alexander G Ghyka
(74) *Attorney, Agent, or Firm* — Brian M. Kaufman; Robert D. Atkins; Patent Law Group: Atkins and Associates, P.C.

(57) ABSTRACT

A semiconductor device has a plurality of first semiconductor die with an encapsulant deposited over a first surface of the first semiconductor die and around the first semiconductor die. An insulating layer is formed over the encapsulant and over a second surface of the first semiconductor die opposite the first surface. The insulating layer includes openings over the first semiconductor die. A first conductive layer is formed over the first semiconductor die within the openings. A second conductive layer is formed over the first conductive layer to form vertical conductive vias. A second semiconductor die is disposed over the first semiconductor die and electrically connected to the first conductive layer. A bump is formed over the second conductive layer outside a footprint of the first semiconductor die. The second semiconductor die is disposed over an active surface or a back surface of the first semiconductor die.

23 Claims, 16 Drawing Sheets

Related U.S. Application Data continuation of application No. 13/771,825, filed on Feb. 20, 2013, now Pat. No. 9,881,894.

(60) Provisional application No. 61/608,402, filed on Mar. 8, 2012.

(51) Int. Cl.
*H01L 21/56* (2006.01)
*H01L 25/03* (2006.01)
*H01L 25/065* (2006.01)
*H01L 25/00* (2006.01)
*H01L 21/768* (2006.01)

(52) U.S. Cl.
CPC .. *H01L 21/76898* (2013.01); *H01L 23/49811* (2013.01); *H01L 24/03* (2013.01); *H01L 24/05* (2013.01); *H01L 24/06* (2013.01); *H01L 24/17* (2013.01); *H01L 24/19* (2013.01); *H01L 24/94* (2013.01); *H01L 24/96* (2013.01); *H01L 24/97* (2013.01); *H01L 25/03* (2013.01); *H01L 25/0657* (2013.01); *H01L 25/50* (2013.01); H01L 23/49822 (2013.01); H01L 24/11 (2013.01); H01L 24/13 (2013.01); H01L 24/16 (2013.01); H01L 2224/02379 (2013.01); H01L 2224/0401 (2013.01); H01L 2224/04042 (2013.01); H01L 2224/04105 (2013.01); H01L 2224/051 (2013.01); H01L 2224/056 (2013.01); H01L 2224/05008 (2013.01); H01L 2224/05022 (2013.01); H01L 2224/05552 (2013.01); H01L 2224/05569 (2013.01); H01L 2224/05571 (2013.01); H01L 2224/0603 (2013.01); H01L 2224/11 (2013.01); H01L 2224/1132 (2013.01); H01L 2224/1145 (2013.01); H01L 2224/1146 (2013.01); H01L 2224/11334 (2013.01); H01L 2224/12105 (2013.01); H01L 2224/13022 (2013.01); H01L 2224/13111 (2013.01); H01L 2224/13113 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/141 (2013.01); H01L 2224/1403 (2013.01); H01L 2224/14135 (2013.01); H01L 2224/16145 (2013.01); H01L 2224/16225 (2013.01); H01L 2224/1703 (2013.01); H01L 2224/32225 (2013.01); H01L 2224/48091 (2013.01); H01L 2224/73204 (2013.01); H01L 2224/73259 (2013.01); H01L 2224/73265 (2013.01); H01L 2224/81 (2013.01); H01L 2224/81005 (2013.01); H01L 2224/81191 (2013.01); H01L 2224/81193 (2013.01); H01L 2224/81805 (2013.01); H01L 2224/83 (2013.01); H01L 2224/94 (2013.01); H01L 2224/96 (2013.01); H01L 2224/97 (2013.01); H01L 2225/06513 (2013.01); H01L 2225/06541 (2013.01); H01L 2924/00011 (2013.01); H01L 2924/00014 (2013.01); H01L 2924/01322 (2013.01); H01L 2924/12041 (2013.01); H01L 2924/12042 (2013.01); H01L 2924/1306 (2013.01); H01L 2924/13091 (2013.01); H01L 2924/15311 (2013.01); H01L 2924/181 (2013.01); H01L 2924/18161 (2013.01); H01L 2924/18162 (2013.01); H01L 2924/3511 (2013.01)

(56) References Cited

U.S. PATENT DOCUMENTS

| | | | |
|---|---|---|---|
| 6,159,767 A | | 12/2000 | Eichelberger |
| 7,122,904 B2 | | 10/2006 | Tsai et al. |
| 7,417,290 B2 | | 8/2008 | Purtell et al. |
| 7,417,299 B2 | | 8/2008 | Hu |
| 8,039,304 B2 | | 10/2011 | Pagaila |
| 9,881,894 B2 | | 1/2018 | Pendse |
| 10,692,836 B2 * | | 6/2020 | Pendse .............. H01L 21/76898 |
| 2005/0184377 A1 | | 8/2005 | Takeuchi et al. |
| 2008/0079157 A1 | | 4/2008 | Kurita et al. |
| 2009/0001540 A1 | | 1/2009 | Yang et al. |
| 2009/0039492 A1 | | 2/2009 | Kang et al. |
| 2009/0065907 A1 | | 3/2009 | Haba et al. |
| 2010/0140779 A1 | | 6/2010 | Lin et al. |
| 2010/0289131 A1 | | 11/2010 | Bathan et al. |
| 2010/0330743 A1 | | 12/2010 | Yu et al. |
| 2011/0031634 A1 | | 2/2011 | Pagaila |
| 2011/0157853 A1 * | | 6/2011 | Goh ....................... H01L 24/05 361/783 |
| 2011/0177654 A1 | | 7/2011 | Lee et al. |
| 2011/0186992 A1 | | 8/2011 | Wu et al. |
| 2011/0193217 A1 * | | 8/2011 | Meyer-Berg ........ H01L 23/3121 257/734 |
| 2011/0291288 A1 | | 12/2011 | Wu et al. |
| 2012/0018871 A1 | | 1/2012 | Lee et al. |
| 2012/0049344 A1 | | 3/2012 | Pagaila et al. |
| 2012/0074585 A1 | | 3/2012 | Koo et al. |
| 2012/0106117 A1 | | 5/2012 | Sundaram et al. |
| 2012/0187568 A1 | | 7/2012 | Lin et al. |
| 2012/0228749 A1 | | 9/2012 | Pagaila |
| 2013/0214432 A1 | | 8/2013 | Wu et al. |

FOREIGN PATENT DOCUMENTS

| | | |
|---|---|---|
| JP | 2005217225 A | 8/2005 |
| JP | 200891640 A | 4/2008 |
| KR | 20090014631 A | 2/2009 |
| KR | 20110123297 A | 11/2011 |

* cited by examiner

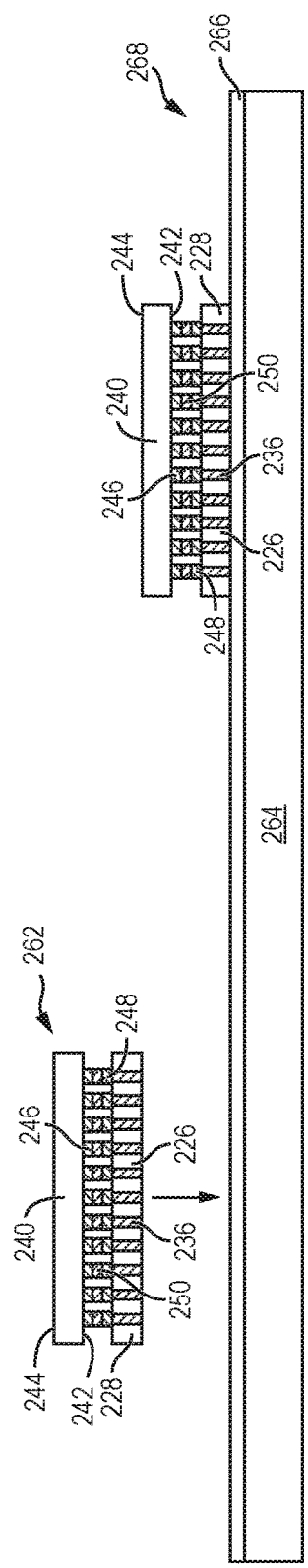
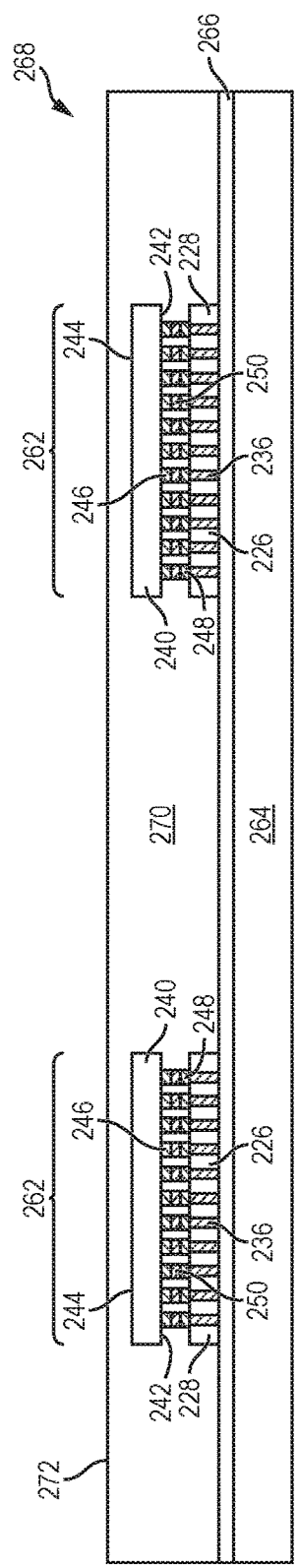
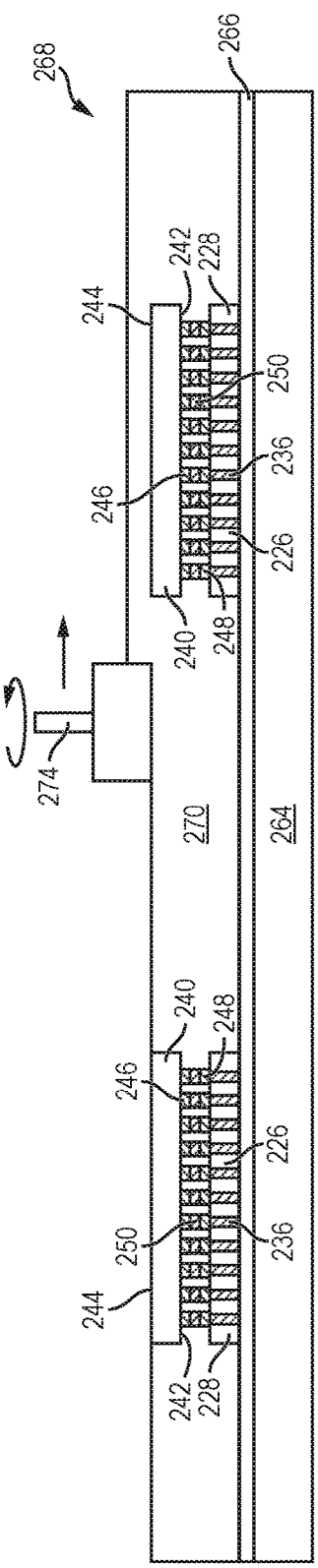

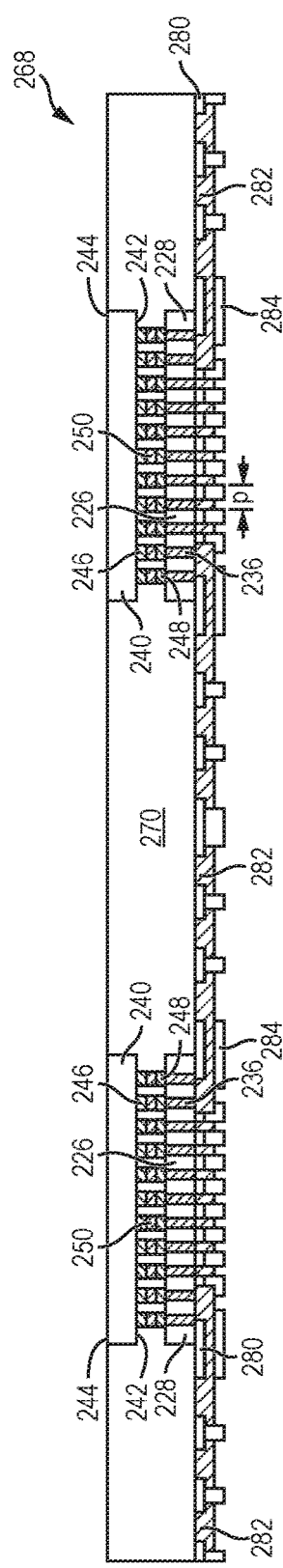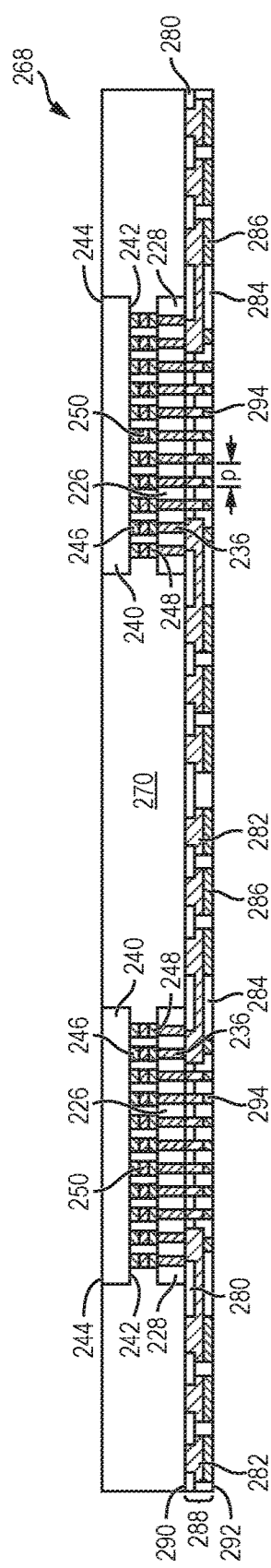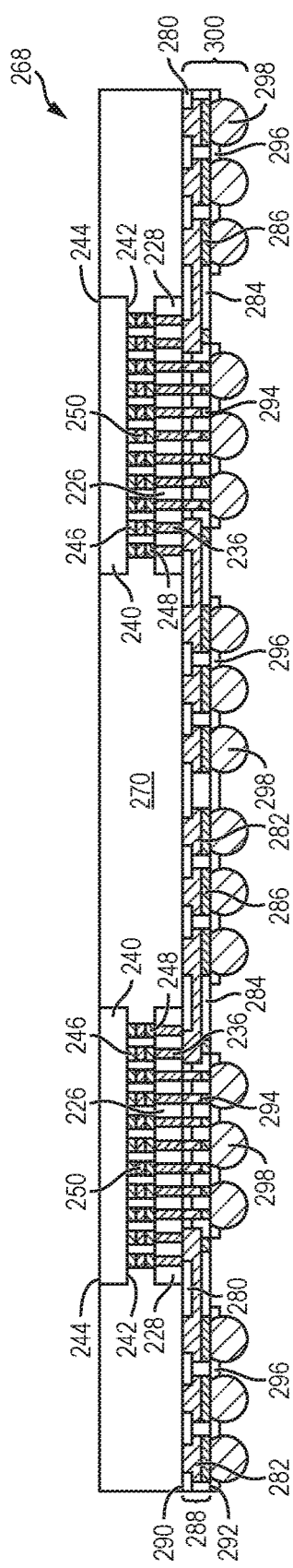
FIG. 5j
FIG. 5k
FIG. 5l

THIN 3D FAN-OUT EMBEDDED WAFER LEVEL PACKAGE (EWLB) FOR APPLICATION PROCESSOR AND MEMORY INTEGRATION

CLAIM TO DOMESTIC PRIORITY

The present application is a continuation of U.S. patent application Ser. No. 15/827,478, now U.S. Pat. No. 10,692,836, filed Nov. 30, 2017, which is a continuation of U.S. patent application Ser. No. 13/771,825, now U.S. Pat. No. 9,881,894, filed Feb. 20, 2013, which claims the benefit of U.S. Provisional Application No. 61/608,402, filed Mar. 8, 2012, which applications are incorporated herein by reference.

FIELD OF THE INVENTION

The present invention relates in general to semiconductor devices and, more particularly, to a semiconductor device and method of forming a fan-out embedded wafer level ball grid array (Fo-eWLB) including a thin film interconnect structure having fine pitch interconnects.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming electrical interfaces that are capable of operating at higher speeds. Higher operating speeds can be achieved by shortening signal path lengths within the semiconductor device package. One approach to achieving the objectives of greater integration and smaller, higher-speed semiconductor devices is to focus on three dimensional (3D) packaging technologies including package-on-package (PoP). The electrical interconnection between devices in a semiconductor structure and external devices can be accomplished with conductive through silicon vias (TSV) or through hole vias (THV).

The vertical z-direction interconnect of a THV substrate consumes space, increases the overall height of the package, and imposes higher manufacturing costs. The thickness of a THV substrate limits the extent by which the signal path length and overall package thickness can be reduced. The signal path length in a THV substrate limits the speed and electrical performance of the semiconductor device. A conventional THV substrate is 250 micrometers ($\mu$m) to 350 $\mu$m thick. The thickness of the THV substrate leads to warpage and reduced thermal performance. Further, the vias in a THV substrate are often formed by laser drilling which limits the via pitch that can be achieved in the THV substrate. A conventional THV substrate has a via pitch of 100 $\mu$m or greater. The minimum achievable via pitch within a THV substrate is insufficient for mounting high density semiconductor devices and limits the flexibility of semiconductor device integration in the 3D semiconductor structures.

DETAILED DESCRIPTION OF THE DRAWINGS

Figure 1:
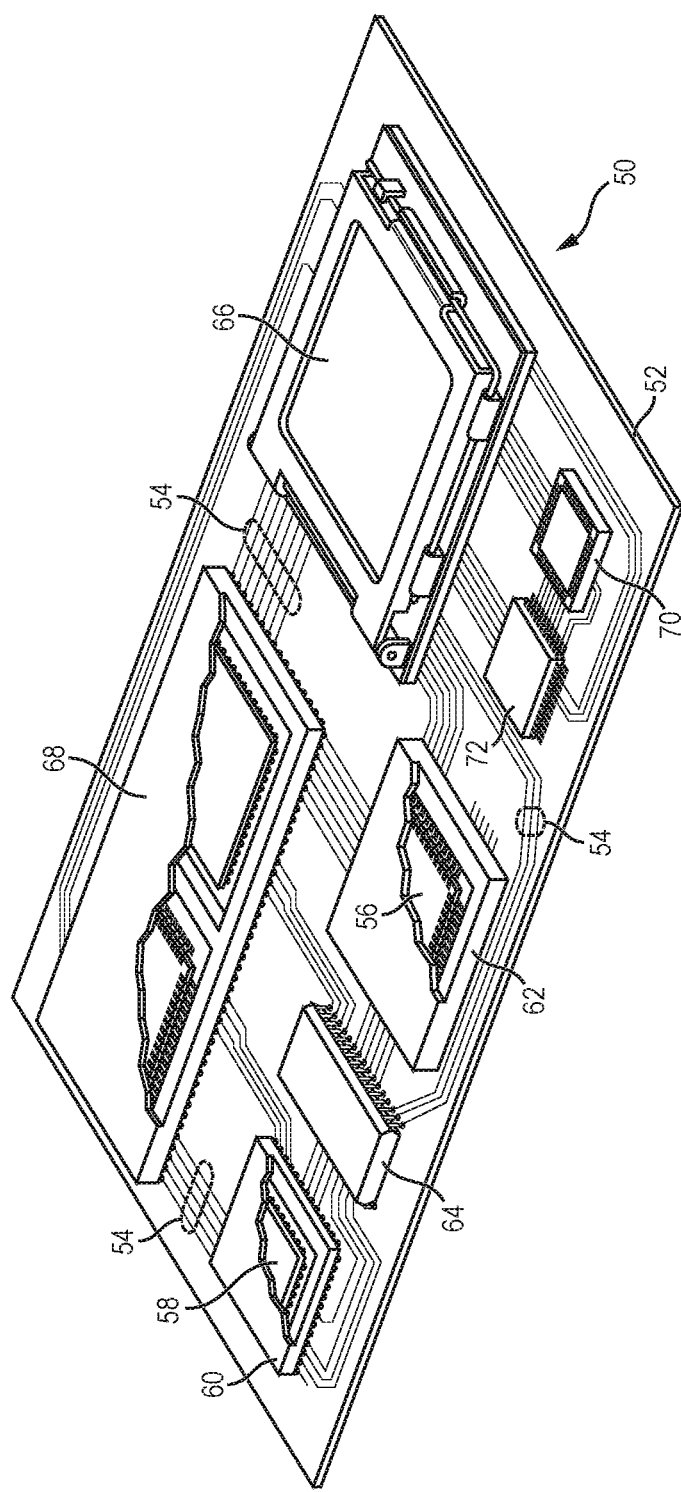
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
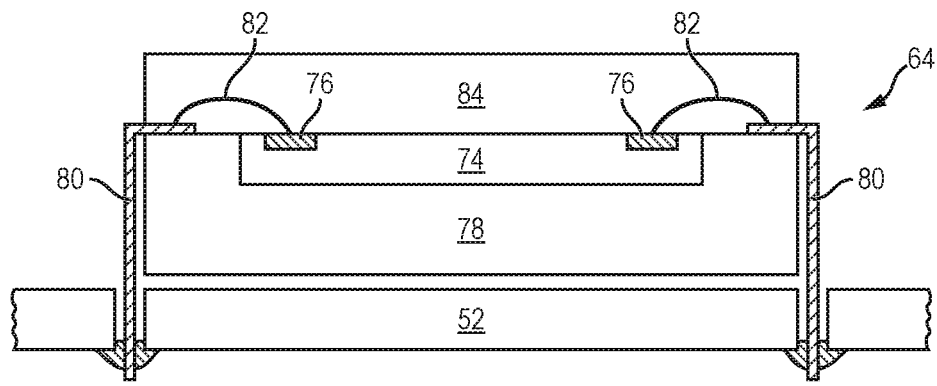
FIGS. 2a-2c illustrate further detail of the representative semiconductor packages mounted to the PCB.
Figure 2B:
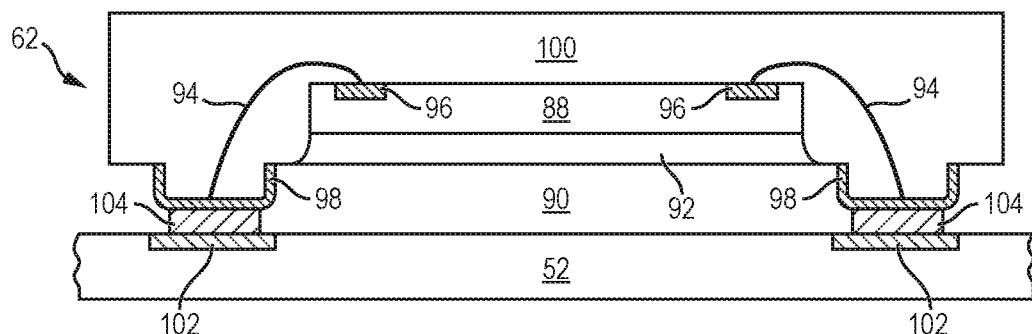
Figure 2C:
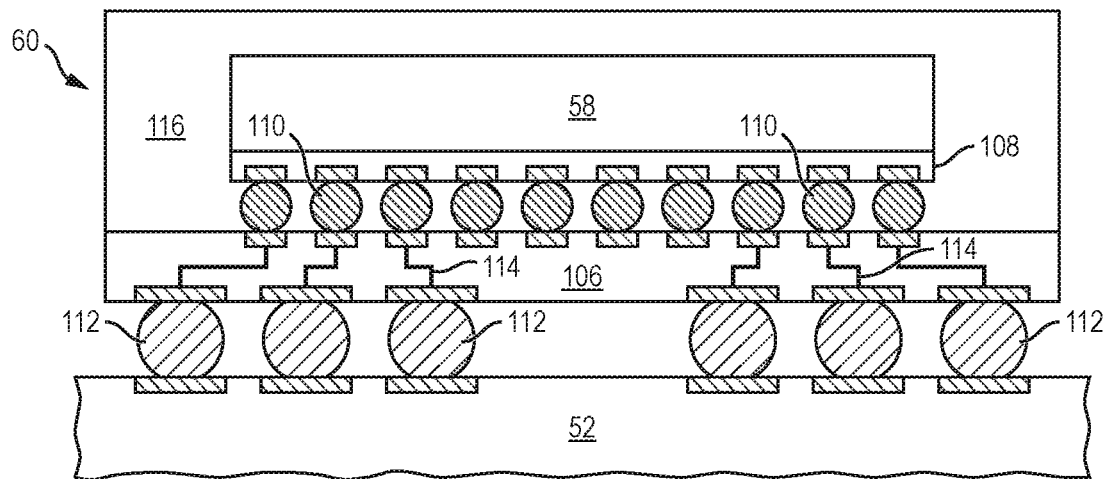

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
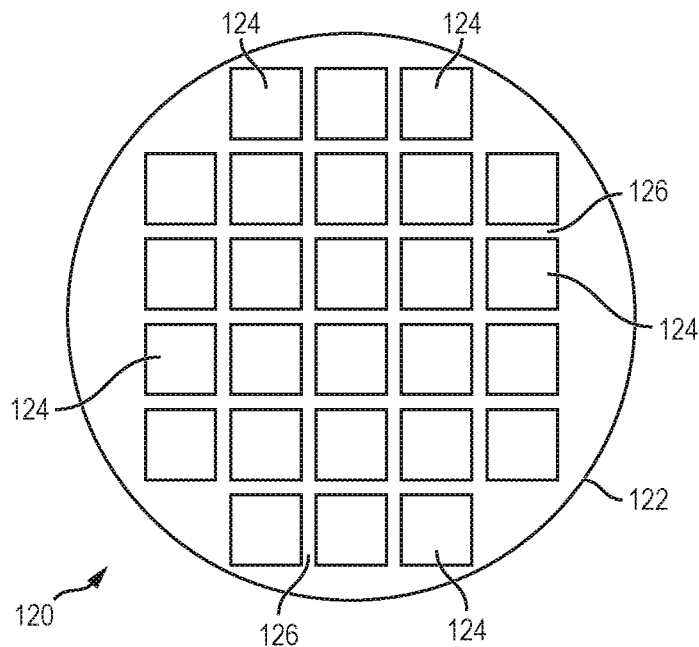
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
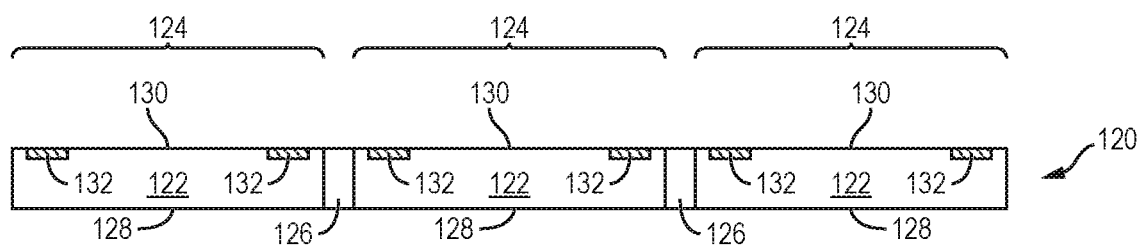

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may include discrete devices. Discrete devices can be active devices, such as transistors and diodes, or passive devices, such as capacitors, resistors, and inductors for RF signal processing. Semiconductor die 124 may also include a packaged semiconductor die. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
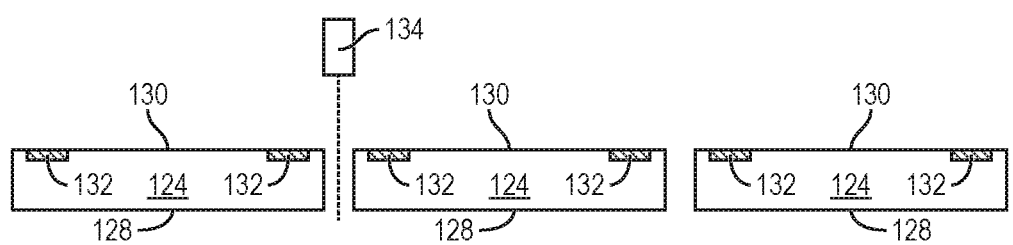

In FIG. 3c, semiconductor wafer 120 is singulated through saw street 126 using a saw blade or laser cutting tool 134 into individual semiconductor die 124.

Figure 4A:
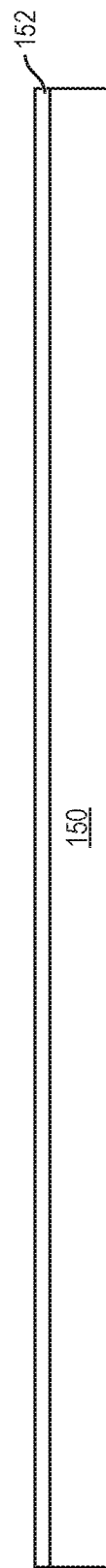
FIGS. 4a-4n illustrate a process of forming a Fo-eWLB including a thin film interconnect structure having fine pitch interconnects and semiconductor die mounted to opposing sides of the thin film interconnect structure.

FIGS. 4a-4m illustrate a process of forming a Fo-eWLB including a thin film interconnect structure having fine pitch interconnects and semiconductor die mounted to opposing sides of the thin film interconnect structure. FIG. 4a shows a portion of substrate or carrier 150 containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 152 is formed over carrier 150 as a temporary adhesive bonding film, etch-stop layer, or release layer.

Figure 4B:
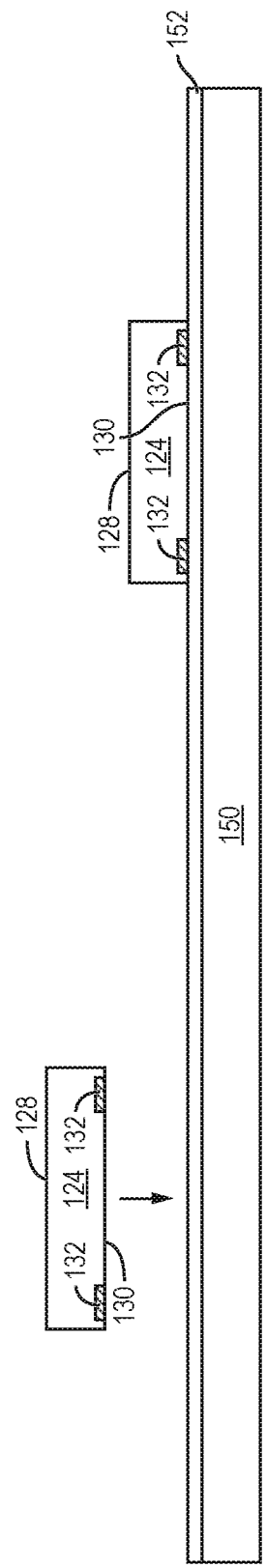

In FIG. 4b, semiconductor die 124 from FIG. 3c are mounted to interface layer 152 and over carrier 150 using, for example, a pick and place operation with active surface 130 oriented toward the carrier.

Figure 4C:
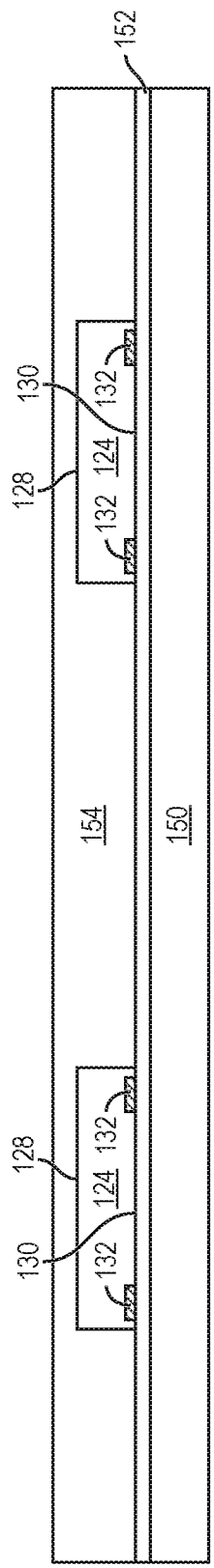

In FIG. 4c, an encapsulant or molding compound 154 deposited over interface layer 152 and carrier 150 and over and around semiconductor die 124 using a paste printing, compressive molding, transfer molding, liquid encapsulant molding, vacuum lamination, film-assisted molding, or other suitable applicator. Encapsulant 154 is formed over back surface 128 of semiconductor die 124, and can be thinned in a subsequent backgrinding step. Encapsulant 154 can also be deposited such that the encapsulant is coplanar with back surface 128, and does not cover the back surface. Encapsulant 154 can be polymer composite material, such as epoxy resin with filler, epoxy acrylate with filler, or polymer with proper filler. Encapsulant 154 is non-conductive, provides physical support, and environmentally protects the semiconductor device from external elements and contaminants.

Figure 4D:
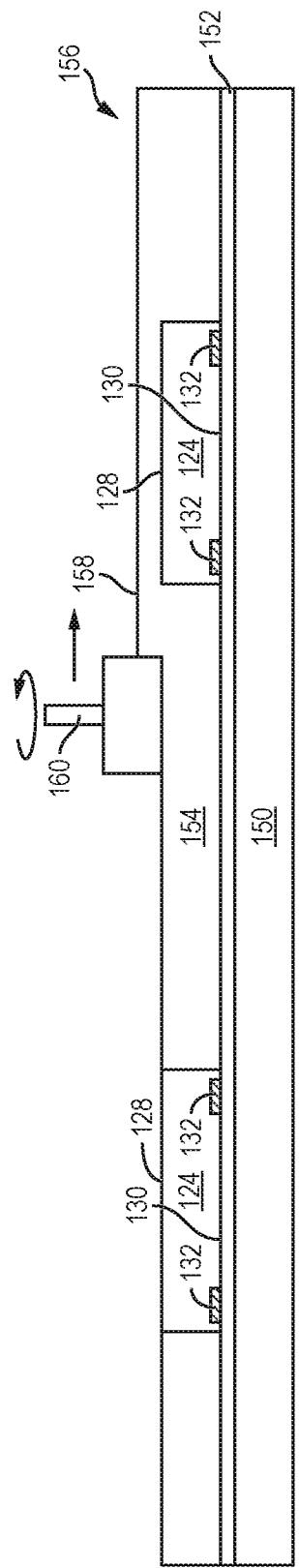
Figure 4E:
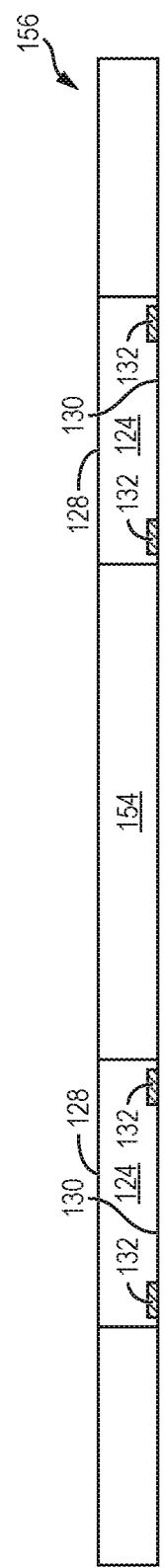

FIG. 4d shows composite substrate or reconstituted wafer 156 covered by encapsulant 154. In FIG. 4d, surface 158 of encapsulant 154 undergoes an optional grinding operation with grinder 160 to planarize the surface and reduce thickness of the encapsulant. A chemical etch can also be used to remove and planarize encapsulant 154. FIG. 4e shows a portion of encapsulant 154 removed to expose back surface 128 of semiconductor die 124.

In FIG. 4e, carrier 150 and interface layer 152 are removed from composite substrate 156 by chemical etching, mechanical peeling, chemical mechanical planarization (CMP), mechanical grinding, thermal bake, UV light, laser scanning, or wet stripping to facilitate the formation of an interconnect structure over active surface 130 of semiconductor die 124 and encapsulant 154 around a periphery of the semiconductor die.

Figure 4F:
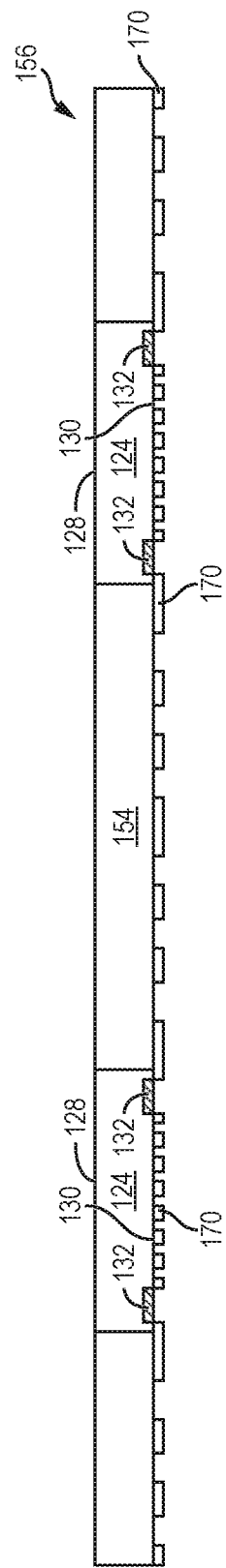

In FIG. 4f, an insulating or passivation layer 170 is formed over semiconductor die 124 and encapsulant 154. Insulating layer 170 contains one or more layers of low temperature curable polymer dielectric resist (i.e., cures at less than 260 degrees Celsius (C)) with or without filler, silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. Insulating layer 170 is deposited using PVD, CVD, printing, spin coating, spray coating, sintering, thermal oxidation, or other suitable process. Insulating layer 170 has a thickness of less than 10 μm and is typically as thin as 4 μm. A portion of insulating layer 170 is removed by an exposure or development process, laser direct ablation (LDA), etching, or other suitable process to form openings over conductive layer 132. The openings expose conductive layer 132 of semiconductor die 124 for subsequent electrical interconnect.

Figure 4G:
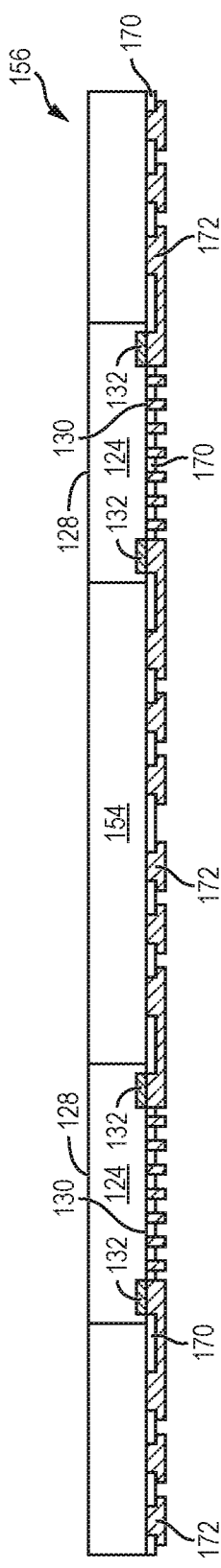

In FIG. 4g, an electrically conductive layer 172 is patterned and deposited over insulating layer 170, over semiconductor die 124, and disposed within the openings in insulating layer 170 to fill the openings and contact conductive layer 132 as one or more layers, including seed layers. The one or more layers of conductive layer 172 include Al, Cu, Sn, Ni, Au, Ag, titanium (Ti)/Cu, titanium tungsten (TiW)/Cu, Ti/nickel vanadium (NiV)/Cu, TiW/NiV/Cu, or other suitable electrically conductive material. The deposition of conductive layer 172 uses PVD, CVD, electrolytic plating, electroless plating, or other suitable process. Conductive layer 172 has a thickness of less than 15 μm and is typically as thin as 3 μm. Conductive layer 172 operates as an RDL to fan-out and extend electrical connection from semiconductor die 124 to points external to semiconductor die 124.

Figure 4H:
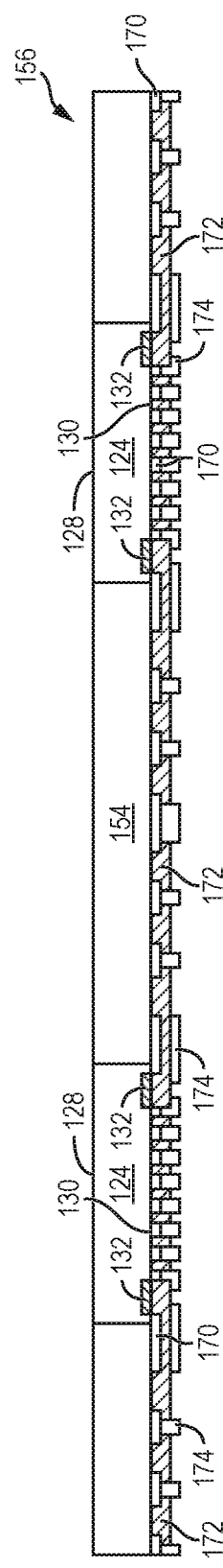

In FIG. 4h, an insulating or passivation layer 174 is formed over insulating layer 170 and conductive layer 172. Insulating layer 174 contains one or more layers of low temperature curable polymer dielectric resist (i.e., cures at less than 260 degrees C.) with or without filler, SiO2, Si3N4, SiON, Ta2O5, Al2O3, or other material having similar insulating and structural properties. Insulating layer 174 is deposited using PVD, CVD, printing, spin coating, spray coating, sintering, thermal oxidation, or other suitable process. Insulating layer 174 has a thickness of less than 10 μm and is typically as thin as 4 μm. A portion of insulating layer 174 is removed by an exposure or development process, LDA, etching, or other suitable process to form openings in the insulating layer, which expose portions of conductive layer 172 for subsequent electrical interconnection.

Figure 4I:
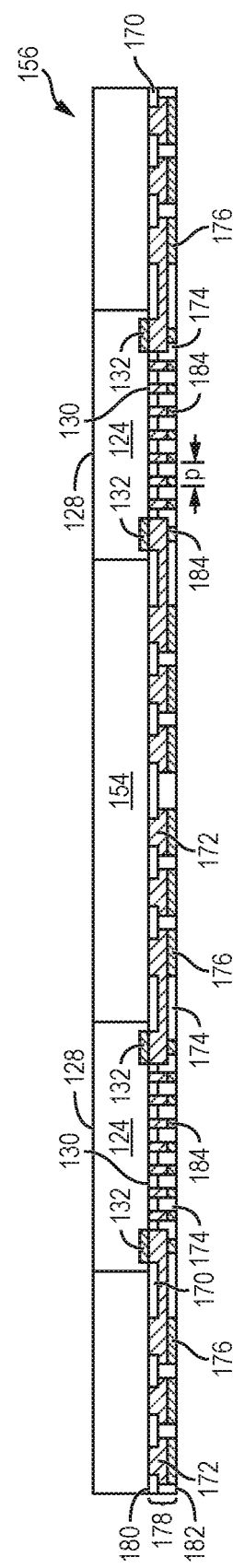

In FIG. 4i, an electrically conductive layer 176 is patterned and deposited over insulating layer 174, over conductive layer 172, and disposed within the openings in insulating layer 174 as one or more layers, including seed layers, to fill the openings and contact and electrically connect to conductive layer 172. The one or more layers of conductive layer 176 include Al, Cu, Sn, Ni, Au, Ag, Ti/Cu, TiW/Cu, Ti/NiV/Cu, TiW/NiV/Cu, or other suitable electrically conductive material. The deposition of conductive layer 176 uses PVD, CVD, electrolytic plating, electroless plating, or other suitable process. Conductive layer 176 has a thickness of less than 15 μm and is typically as thin as 3 μm. In one embodiment, the deposition of conductive layer 176 includes selective plating with a seed layer and lithography. Conductive layer 176 operates as an RDL to fan-out and extend electrical connection from semiconductor die 124 to points external to semiconductor die 124.

Insulating layers 170 and 174 together with conductive layers 172 and 176 form thin film 178. Thin film 178 constitutes an interconnect structure. In an alternative embodiment, thin film 178 may include as few as one conductive layer, such as conductive layer 172. In another alternative embodiment, thin film 178 includes two or more RDL layers, such as conductive layers 172 and 176 and additional conductive layers similar to conductive layers 172 and 176. Thin film 178 may include as many insulating and conductive layers as necessary for the interconnect density and electrical routing needed for the particular semiconductor device.

Thin film 178 includes surface 180 over which semiconductor die 124 is disposed and surface 182 opposite surface 180. Thin film 178 has a thickness of less than 50 μm, which is thinner than a conventional THV substrate which typically has a thickness of 250 to 350 μm. Thin film 178 is formed from layers of insulating and conductive material which can each be formed with a thickness of less than 10 μm. The thin layers of insulating and conductive material allow horizontal and vertical interconnects to be formed in close proximity to adjacent horizontal and vertical interconnects within the thin layers (e.g., with a pitch of less than 50 μm). With horizontal and vertical interconnects formed in close proximity to adjacent interconnects, a higher density of interconnects is achieved within the interconnect structure. Because thin film 178 includes higher density interconnects, thin film 178 provides more flexibility in integration of semiconductor devices into the 3D semiconductor structure. The high density interconnect structure accommodates semiconductor die with varying bump pitch, for example, semiconductor die from multiple manufacturing sources.

Conductive layers 172 and 176 form horizontal and vertical interconnections or vertical conductive vias 184 through thin film 178. Horizontal and vertical interconnections are formed as close together as necessary for connection to a semiconductor die or component or for routing electrical signals through thin film 178. For example, conductive layers 172 and 176 may include conductive traces. A first conductive trace is formed in close proximity to a second conductive trace (e.g., a pitch between conductive traces is less than 50 μm). The fine pitch between conductive traces allows space for more conductive traces to be formed within thin film 178, while the thinness of each thin film layer reduces the thickness of the interconnect structure compared to a conventional THV substrate.

Conductive layers 172 and 176 also form vertical conductive vias 184 in which a first vertical conductive via is formed in close proximity to a second vertical conductive via (e.g., a pitch between vertical conductive vias is less than 50 μm). Conductive layer 172 includes a first portion of vertical conductive vias 184, and conductive layer 176 includes a second portion of vertical conductive vias 184. Vertical conductive vias 184 may extend from surface 180 to surface 182 of thin film 178 or vertical conductive vias 184 may be formed partially through thin film 178. A pitch P between vertical conductive vias 184 is less than 50 μm. The pitch P between vertical conductive vias 184 in thin film 178 is finer than the pitch between conductive vias in a conventional through-hole via (THV) substrate, which is typically 100 μm or greater.

The fine pitch horizontal and vertical interconnections in thin film 178 provide a higher interconnect density and input/output (I/O) terminal count. Thin film 178 provides an interconnect pitch which allows high density semiconductor die to be mounted to either or both of surfaces 180 and 182 of thin film 178 in a flipchip orientation. Semiconductor die can be mounted in a face-to-face orientation on thin film 178. Thin film 178 extends beyond a footprint of semiconductor die 124 in a fan-out design to further increase the I/O terminal count. The thinness of thin film 178 allows for a smaller and thinner overall semiconductor device package, which reduces warpage and increases the speed of the device. Further, the high density interconnects accommodates more electrical signals per 3D semiconductor structure and improves the compatibility of the interconnect structure with a greater variety of semiconductor device and components types.

Figure 4J:
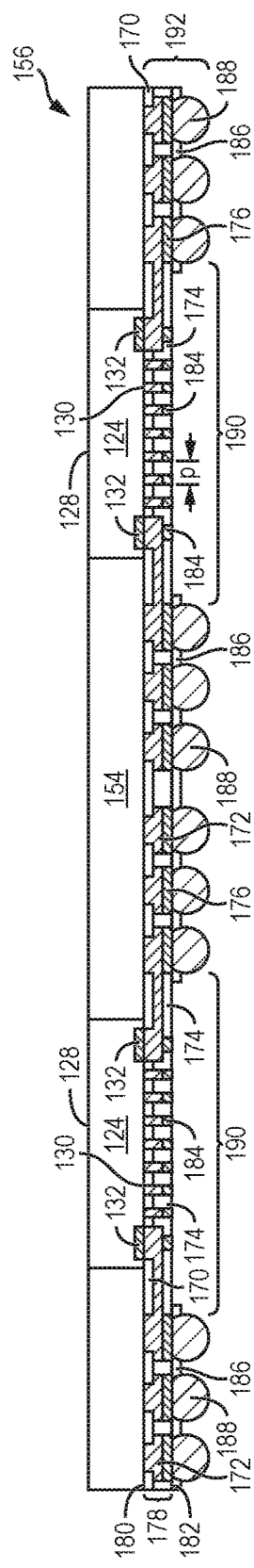

In FIG. 4j, an optional insulating or passivation layer 186 is formed over insulating layer 174 and conductive layer 176. Insulating layer 186 contains one or more layers of low temperature curable polymer dielectric resist (i.e., cures at less than 260 degrees C.) with or without filler, SiO2, Si3N4, SiON, Ta2O5, Al2O3, or other material having similar insulating and structural properties. Insulating layer 186 is deposited using PVD, CVD, printing, spin coating, spray coating, sintering, thermal oxidation, or other suitable process. A portion of insulating layer 186 is removed by an exposure or development process, LDA, etching, or other suitable process to form openings in the insulating layer, which expose portions of conductive layer 176 for subsequent electrical interconnection.

FIG. 4j also shows an electrically conductive bump material deposited over conductive layer 176, within the openings in insulating layer 186. Bumps 188 are formed over conductive layer 176. Alternatively, if thin film 178 includes one RDL layer, such as conductive layer 172, bumps 188 are formed over the single RDL layer. Bumps 188 can be formed over conductive layer 172 or 176 or an additional conductive layer. Bumps 188 are formed over the area of thin film 178 outside a footprint of semiconductor die 124. Bumps 188 can also be formed in the area of thin film 178 directly underneath or overlapping with the footprint of semiconductor die 124.

Bumps 188 are formed using evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form spherical balls or bumps 188. In some applications, bumps 188 are reflowed a second time to improve electrical contact to conductive layer 176. In one embodiment, bumps 188 are formed over a under bump metallization (UBM) having a wetting layer, barrier layer, and adhesive layer. The bumps can also be compression bonded to conductive layer 176. Bumps 188 represent one type of interconnect structure that can be formed over conductive layer 176. The interconnect structure can also use bond wires, conductive paste, stud bump, micro bump, or other electrical interconnect.

FIG. 4j also shows region 190 of thin film 178 where bumps 188 are not formed over conductive layer 176 of thin film 178. Alternatively, bumps 188 are formed over conductive layer 176 in region 190 and are subsequently removed from region 190. In another alternative embodiment, some of bumps 188 are formed and remain in region 190 of thin film 178. Region 190 is configured with bumps 188 or without bumps 188 depending on the interconnect requirements for the particular semiconductor device. Region 190 of thin film 178 provides a connection site for a second semiconductor die or component to be mounted over surface 182 of thin film 178. In one embodiment, region 190 includes surface 180 of thin film 178 directly opposite from the area of thin film 178 on which semiconductor die 124 is disposed.

Taken together, insulating layers 170, 174, and 186 as well as conductive layers 172, 176, and conductive bumps 188 form interconnect structure 192. The number of insulating and conductive layers included within interconnect structure 192 depends on, and varies with, the complexity of the circuit routing design. Accordingly, interconnect structure 192 can include one or more insulating and conductive layers to facilitate electrical interconnect with respect to semiconductor die 124. Elements that would otherwise be included in a backside interconnect structure or RDL can be integrated as part of interconnect structure 192 to simplify manufacturing and reduce fabrication costs with respect to a package including both front side and backside interconnects or RDLs.

Figure 4K:
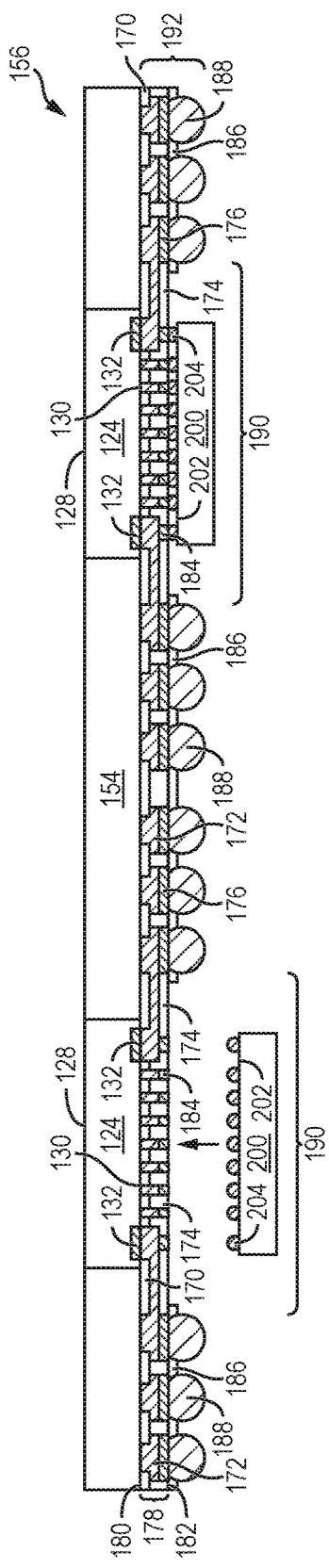

In FIG. 4k, semiconductor die or components 200 are mounted to interconnect structure 192 over semiconductor die 124 in region 190 of thin film 178. Each semiconductor die 200 has contact pads formed on active surface 202 oriented toward semiconductor die 124 and toward surface 182 of thin film 178 and electrically connected to conductive layers 172 and 176 of vertical conductive vias 184. Active surface 202 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 202 to implement analog circuits or digital circuits, such as DSP, ASIC, memory, application processor, or other signal processing circuit. Semiconductor die 200 may include discrete devices. Discrete devices can be active devices, such as transistors and diodes, or passive devices, such as capacitors, resistors, and inductors for RF signal processing. Semiconductor die 200 may also include a packaged semiconductor die. A plurality of bumps 204 is formed over semiconductor die 200 and reflowed to electrically connect contact pads of semiconductor die 200 to conductive layer 176. In one embodiment, semiconductor die 200 is implemented as a flipchip style device. The height of semiconductor die 200 disposed on interconnect structure 192 is less than or equal to a height of bumps 188 disposed on interconnect structure 192 outside a footprint of semiconductor die 200. In one embodiment, the height of bumps 188 exceeds a height of semiconductor die 200.

Figure 4L:
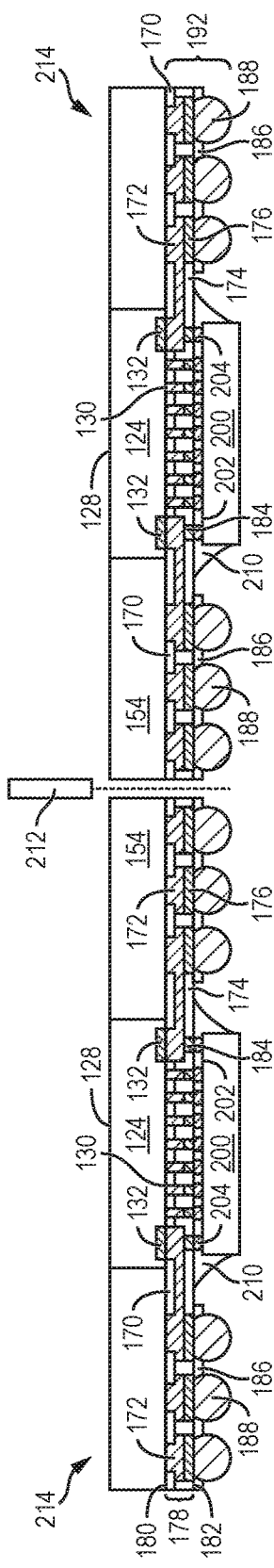

In FIG. 4l, an optional underfill material 210 is deposited under semiconductor die 200. Underfill materials include epoxy, epoxy-resin adhesive material, polymeric materials, films, or other non-conductive materials. Underfill 210 is non-conductive and environmentally protects the semiconductor device from external elements and contaminants.

In one embodiment, after the formation of bumps 188, composite substrate or reconstituted wafer 156 is singulated with saw blade or laser cutting device 212 into individual semiconductor devices 214. By singulating composite substrate 156 before mounting additional semiconductor devices over the composite substrate, the formation of individual semiconductor devices 214 are accomplished by mounting the additional semiconductor die at the individual device level rather than at the reconstituted wafer level. Alternatively, composite substrate 156 is singulated after additional semiconductor devices are mounted to the composite substrate as shown in FIG. 4l.

Figure 4M:
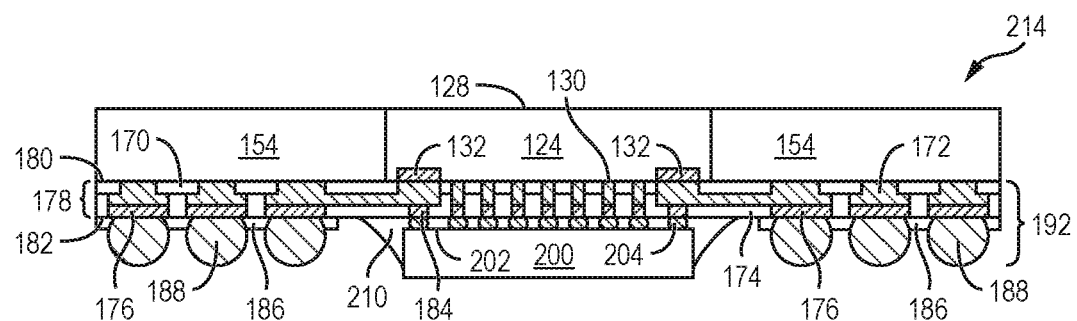

FIG. 4m shows an individual semiconductor device 214 after singulation. Semiconductor device 214 is a 3D semiconductor structure with semiconductor die disposed on opposing sides of thin film 178 of interconnect structure 192. Semiconductor device 214 including fine pitch vertical conductive vias 184 accommodates high density semiconductor die, such as wide I/O memory devices, in a flipchip orientation. Semiconductor device 214 also accommodates mixed semiconductor die sizes. For example, a semiconductor die having memory function and an application processor die can be integrated face-to-face into semiconductor device 214. In one embodiment, semiconductor die 124 includes an application processor and semiconductor die 200 includes memory. In another embodiment, semiconductor die 124 includes memory, and semiconductor die 200 includes an application processor. Alternatively, semiconductor die 124 and 200 include other signal processing circuits, discrete devices, components, or packaged devices.

Semiconductor die 124 and 200 are electrically connected through vertical conductive vias 184. Semiconductor device 214 provides vertical drop-down routing of electrical signals between semiconductor die 124 and 200 through the fine pitch vertical conductive vias 184 in thin film 178. The electrical conduction path length within semiconductor device 214 is reduced to 300 μm or less, and is typically less than 100 μm, which results in a higher speed and more efficient device. The thermal path length is also reduced. Thin film 178 with semiconductor die 124 and 200 disposed on opposing sides reduces the overall package height of semiconductor device 214. The thickness of semiconductor device 214 is 0.5 millimeters (mm) or less, and is typically as thin as 0.2 mm, whereas the package thickness using a conventional THV substrate is 0.7 to 1.4 mm. The smaller package profile of semiconductor device 214 improves the thermal performance of the semiconductor device by reducing warpage and providing a shorter thermal path. The smaller package profile of semiconductor device 214 with thin film layers reduces the parasitic capacitance of the 3D semiconductor structure.

Figure 4N:
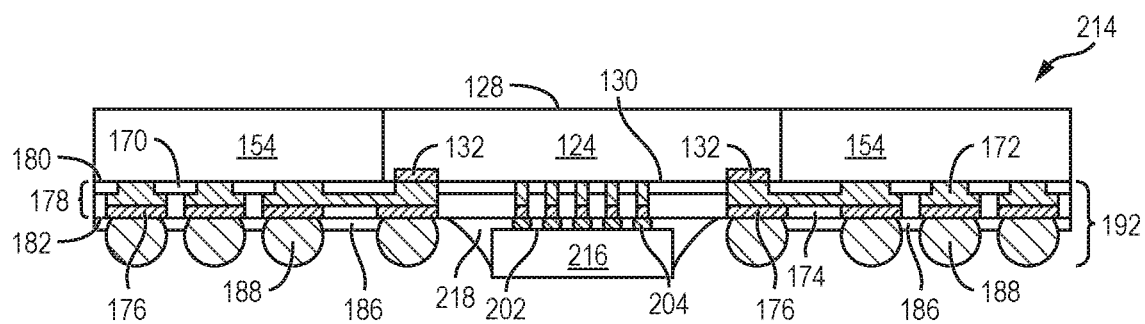

FIG. 4n illustrates an alternative embodiment of semiconductor device 214. Semiconductor die or component 216 is mounted to interconnect structure 192 over semiconductor die 124 in region 190 of thin film 178. Semiconductor die 216 is configured similarly to semiconductor die 200. Semiconductor 216 includes an active surface oriented toward semiconductor die 124 and toward surface 182 of thin film 178 and electrically connected to conductive layers 172 and 176 of vertical conductive vias 184. Semiconductor die 216 is disposed on interconnect structure 192 within a footprint of semiconductor die 124. Alternatively, semiconductor die 216 is disposed partially or entirely outside a footprint of semiconductor die 124. Thin film 178 provides electrical routing capability such that semiconductor die can be mounted to thin film 178 in various configurations. Bumps 188 are formed over thin film 178 in areas of thin film 178 not occupied by semiconductor die 216, or outside a footprint of semiconductor die 216. In one embodiment, semiconductor die 216 is narrower than semiconductor die 124. The shape of semiconductor die 216 leaves space for additional bumps 188 to be formed over thin film 178. Bumps 188 are formed adjacent to or outside a footprint of semiconductor die 216. Bumps 188 are also formed within a footprint of semiconductor die 124 and overlap with the footprint of semiconductor die 124.

Figure 5A:
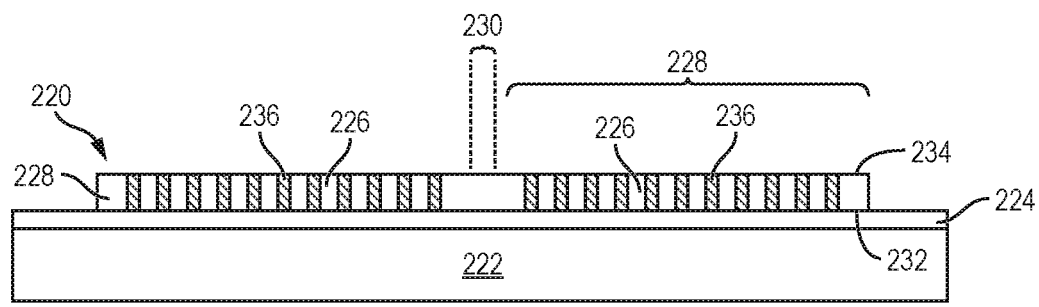
FIGS. 5a-5n illustrate a process of forming a Fo-eWLB including a thin film interconnect structure having fine pitch interconnects and a semiconductor die mounted over a TSV semiconductor die.
Figure 5B:
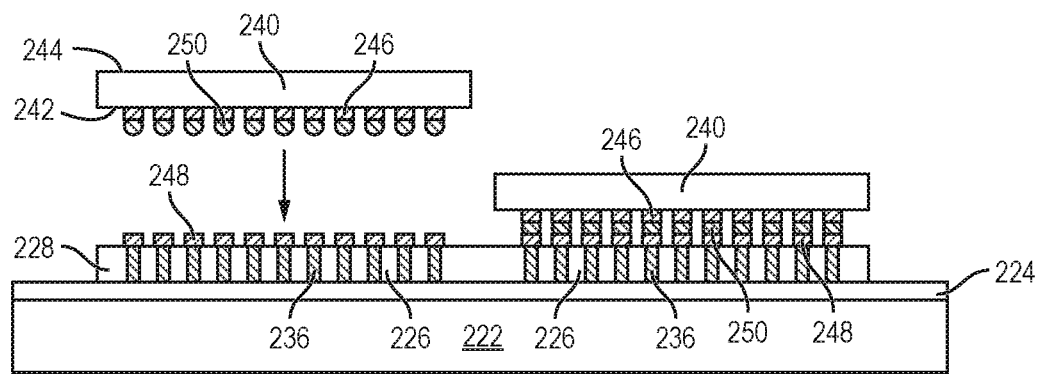
Figure 5C:
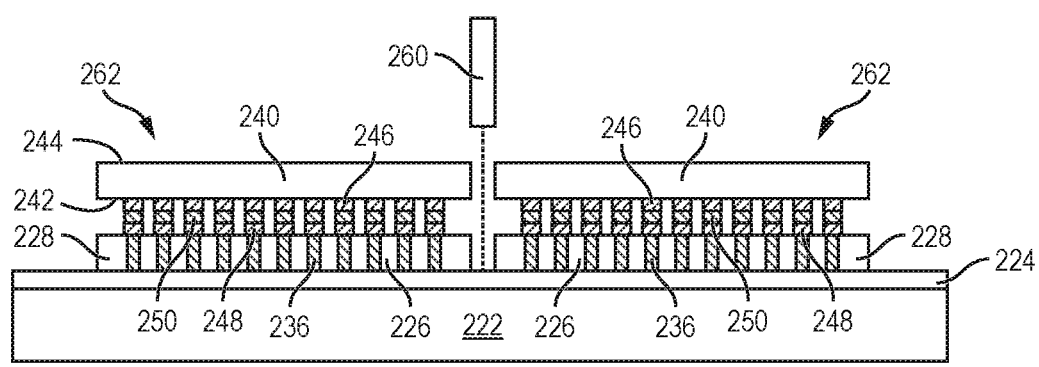
Figure 5G:
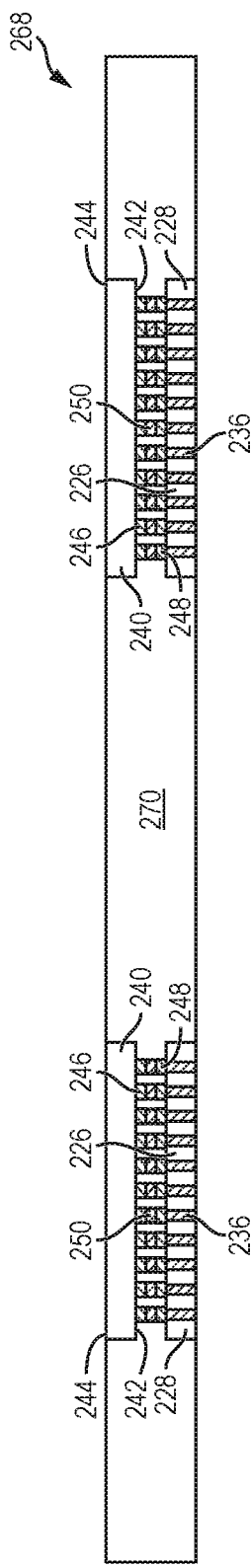
Figure 5H:
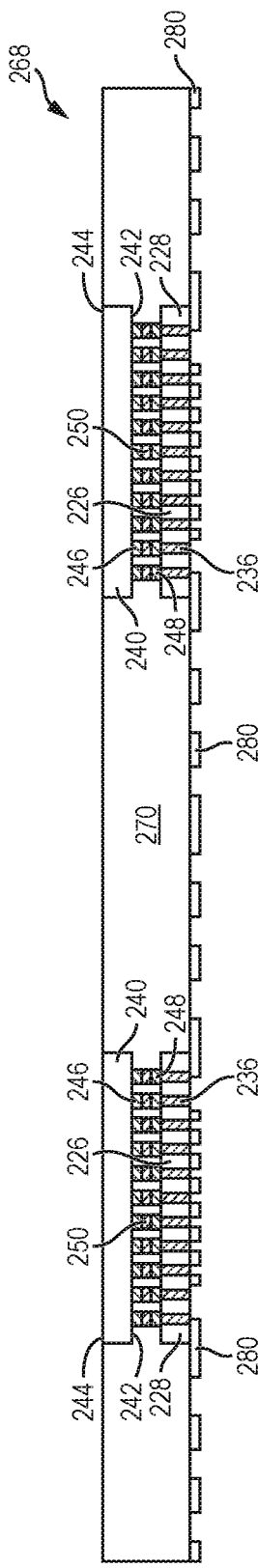
Figure 5I:
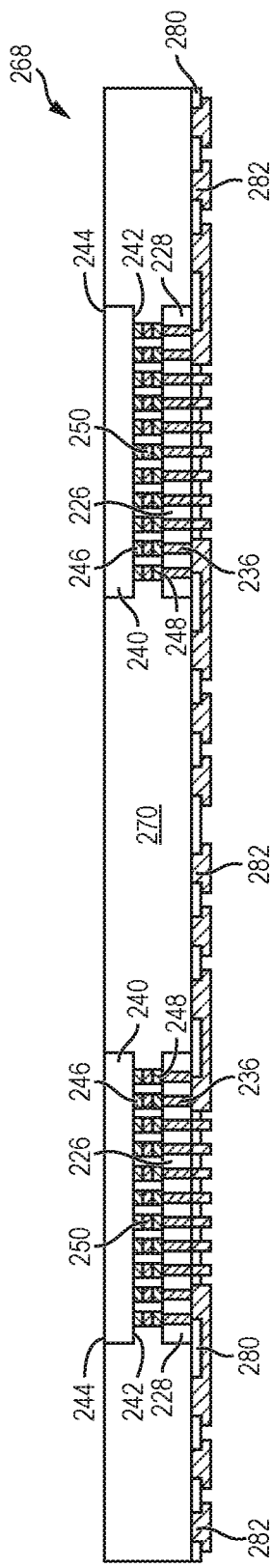
Figure 5M:
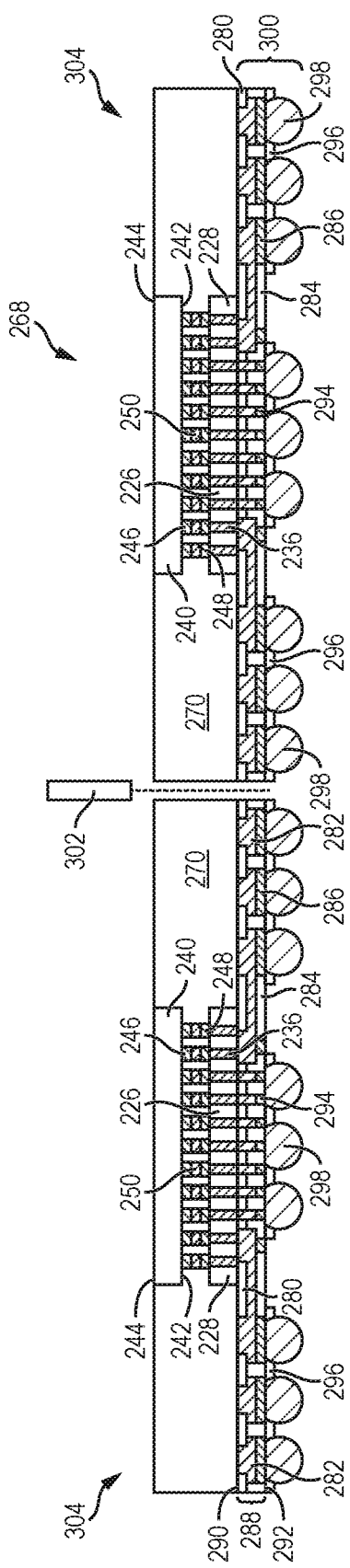
Figure 5N:
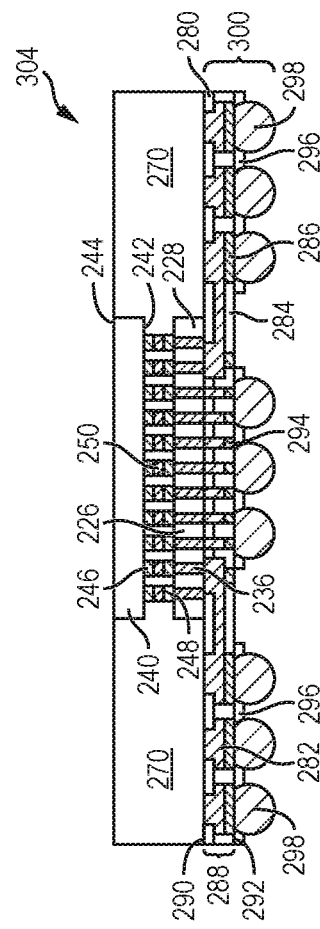

FIGS. 5a-5n illustrate a process of forming a Fo-eWLB including a thin film interconnect structure having fine pitch interconnects and a semiconductor die mounted over a through-silicon via (TSV) semiconductor die. FIG. 5a shows a TSV wafer 220 mounted to carrier or temporary substrate 222. Carrier 222 contains a sacrificial base material such as silicon, polymer, beryllium oxide, glass, or other suitable low-cost, rigid material for structural support. An interface layer or double-sided tape 224 is formed over carrier 222 as a temporary adhesive bonding film, etch-stop layer, or thermal release layer.

TSV wafer 220 includes a base substrate material 226, such as silicon, germanium, gallium arsenide, indium phosphide, or silicon carbide for structural support. A plurality of semiconductor die or components 228 is formed on TSV wafer 220 separated by inter-die wafer area or saw streets 230. Saw streets 230 provide cutting areas to singulate TSV wafer 220 into individual semiconductor die 228. Semiconductor die 228 include active surface 232 and back surface 234 opposite active surface 232. Active surface 232 is oriented toward carrier 222. Active surface 232 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 232 to implement analog circuits or digital circuits, such as DSP, ASIC, memory, application processor, or other signal processing circuit. Semiconductor die 228 may include discrete devices. Discrete devices can be active devices, such as transistors and diodes, or passive devices, such as capacitors, resistors, and inductors for RF signal processing. Semiconductor die 228 may also include a packaged semiconductor die.

A plurality of vias 236 is formed through substrate 226 using mechanical drilling, laser drilling, or deep reactive ion etching (DRIE). Vias 236 extend through substrate 226 of TSV wafer 220. Vias 236 are filled with Al, Cu, Sn, Ni, Au, Ag, Ti, tungsten (W), poly-silicon, or other suitable electrically conductive material using electrolytic plating, electroless plating process, or other suitable metal deposition process to form vertical z-direction conductive TSV.

In FIG. 5b, a plurality of semiconductor die or components 240 is mounted over TSV wafer 220. Semiconductor die 240 includes active surface 242 and back surface 244. Active surface 242 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 242 to implement analog circuits or digital circuits, such as DSP, ASIC, memory, application processor, or other signal processing circuit. Semiconductor die 240 may also include discrete devices or components such as power transistors, or IPD, such as inductors, capacitors, and resistors, for RF signal processing. Semiconductor die 240 may also include a packaged semiconductor die. In one embodiment, semiconductor die 228 includes an application processor and semiconductor die 240 includes memory. In another embodiment, semiconductor die 228 includes memory, and semiconductor die 240 includes an application processor. Alternatively, semiconductor die 228 and 240 include other signal processing circuits, discrete devices, components, or packaged devices.

Semiconductor die 240 is disposed over semiconductor die 228 with active surface 242 oriented toward back surface 234 of semiconductor die 228. A conductive layer 246 is formed over active surface 242 of semiconductor die 240. Conductive layer 246 is formed using a metal deposition process such as Cu foil lamination, printing, PVD, CVD, sputtering, electrolytic plating, and electroless plating. Conductive layer 246 can be one or more layers of Al, Cu, Sn, Ni, Au, Ag, Ti, W, or other suitable electrically conductive material.

A conductive layer 248 is formed over back surface 234 of semiconductor die 228. Conductive layer 248 is formed using a metal deposition process such as Cu foil lamination, printing, PVD, CVD, sputtering, electrolytic plating, and electroless plating. Conductive layer 248 can be one or more layers of Al, Cu, Sn, Ni, Au, Ag, Ti, W, or other suitable electrically conductive material. Conductive layer 248 contacts or is electrically connected to vias 236.

An electrically conductive bump material is deposited over conductive layer 246 or conductive layer 248 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 246 and 248 using a suitable attachment or bonding process. In one embodiment, the bump material is reflowed by heating the material above its melting point to form balls or bumps 250. In some applications, bumps 250 are reflowed a second time to improve electrical contact to conductive layer 246 and 248. Bumps 250 can also be compression bonded or thermocompression bonded to conductive layer 246 and 248. Bumps 250 represent one type of interconnect structure that can be formed over conductive layer 246 and 248. The interconnect structure can also use stud bump, micro bump, or other electrical interconnect.

In FIG. 5c, TSV wafer 220 is singulated through saw street 230 with saw blade or laser cutting tool 260 into individual stacked semiconductor devices 262.

In FIG. 5d, a second temporary substrate or carrier 264 contains sacrificial base material such as silicon, polymer, beryllium oxide, or other suitable low-cost, rigid material for structural support. An interface layer or double-sided tape 266 is formed over carrier 264 as a temporary adhesive bonding film or etch-stop layer. Stacked semiconductor devices 262 are positioned over and mounted to interface layer 266 and carrier 264 using a pick and place operation with active surface 232 of semiconductor die 228 oriented toward the carrier. Stacked semiconductor devices 262 mounted to carrier 264 constitute a composite substrate or reconstituted wafer 268.

In FIG. 5e, an encapsulant or molding compound 270 deposited over interface layer 266 and carrier 264 and over and around stacked semiconductor devices 262 using a paste printing, compressive molding, transfer molding, liquid encapsulant molding, vacuum lamination, film-assisted molding, or other suitable applicator. Encapsulant 270 is formed over back surface 244 of semiconductor die 240, and can be thinned in a subsequent backgrinding step. Encapsulant 270 can also be deposited such that the encapsulant is coplanar with back surface 244, and does not cover back surface 244. Encapsulant 270 can be polymer composite material, such as epoxy resin with filler, epoxy acrylate with filler, or polymer with proper filler. Encapsulant 270 is non-conductive, provides physical support, and environmentally protects the semiconductor device from external elements and contaminants.

FIG. 5f shows composite substrate or reconstituted wafer 268 covered by encapsulant 270. In FIG. 5f, surface 272 of encapsulant 270 undergoes an optional grinding operation with grinder 274 to planarize the surface and reduce thickness of the encapsulant. A chemical etch can also be used to remove and planarize encapsulant 270. FIG. 5g shows a portion of encapsulant 270 removed to expose back surface 244 of semiconductor die 240.

In FIG. 5g, carrier 264 and interface layer 266 are removed from composite substrate 268 by chemical etching, mechanical peeling, CMP, mechanical grinding, thermal bake, UV light, laser scanning, or wet stripping to facilitate the formation of an interconnect structure over active surface 232 of semiconductor die 228 and encapsulant 270 around a periphery of the semiconductor die.

In FIG. 5h, an insulating or passivation layer 280 is formed over semiconductor die 228 and encapsulant 270. Insulating layer 280 contains one or more layers of low temperature curable polymer dielectric resist (i.e., cures at less than 260 degrees C.) with or without filler, SiO2, Si3N4, SiON, Ta2O5, Al2O3, or other material having similar insulating and structural properties. Insulating layer 170 is deposited using PVD, CVD, printing, spin coating, spray coating, sintering, thermal oxidation, or other suitable process. Insulating layer 280 has a thickness of less than 10 μm and is typically as thin as 4 μm. A portion of insulating layer 280 is removed by an exposure or development process, LDA, etching, or other suitable process to form openings over active surface 232. The openings expose portions of active surface 232 of semiconductor die 228 and vias 236 for subsequent electrical interconnect.

In FIG. 5i, an electrically conductive layer 282 is patterned and deposited over insulating layer 280, over semiconductor die 228, and disposed within the openings in insulating layer 280 to fill the openings and contact active surface 232 and vias 236. The one or more layers of conductive layer 282 include Al, Cu, Sn, Ni, Au, Ag, Ti/Cu, TiW/Cu, Ti/NiV/Cu, TiW/NiV/Cu, or other suitable electrically conductive material. The deposition of conductive layer 282 uses PVD, CVD, electrolytic plating, electroless plating, or other suitable process. Conductive layer 282 has a thickness of less than 15 μm and is typically as thin as 3 μm. Conductive layer 282 operates as an RDL to fan-out and extend electrical connection from stacked semiconductor device 262 to points external to stacked semiconductor device 262. One portion of conductive layer 282 is electrically connected to contact pads on active surface 232 of semiconductor die 228. Another portion of conductive layer 282 is electrically connected to vias 236. Other portions of conductive layer 282 can be electrically common or electrically isolated depending on the design and function of stacked semiconductor device 262.

In FIG. 5j, an insulating or passivation layer 284 is formed over insulating layer 280 and conductive layer 282. Insulating layer 284 contains one or more layers of low temperature curable polymer dielectric resist (i.e., cures at less than 260 degrees C.) with or without filler, SiO2, Si3N4, SiON, Ta2O5, Al2O3, or other material having similar insulating and structural properties. Insulating layer 284 is deposited using PVD, CVD, printing, spin coating, spray coating, sintering, thermal oxidation, or other suitable process. Insulating layer 284 has a thickness of less than 10 μm and is typically as thin as 4 μm. A portion of insulating layer 284 is removed by an exposure or development process, LDA, etching, or other suitable process to form openings in the insulating layer, which expose portions of conductive layer 282 for subsequent electrical interconnection.

In FIG. 5k, an electrically conductive layer 286 is patterned and deposited over insulating layer 284, over conductive layer 282, and disposed within the openings in insulating layer 284 as one or more layers, including seed layers, to fill the openings and contact and electrically connect to conductive layer 282. The one or more layers of conductive layer 176 include Al, Cu, Sn, Ni, Au, Ag, Ti/Cu, TiW/Cu, Ti/NiV/Cu, TiW/NiV/Cu, or other suitable electrically conductive material. The deposition of conductive layer 286 uses PVD, CVD, electrolytic plating, electroless plating, or other suitable process. Conductive layer 286 has a thickness of less than 15 μm and is typically as thin as 3 μm. In one embodiment, the deposition of conductive layer 286 includes selective plating with a seed layer and lithography. Conductive layer 286 operates as an RDL to fan-out and extend electrical connection from stacked semiconductor device 262 to points external to stacked semiconductor device 262.

Insulating layers 280 and 284 together with conductive layers 282 and 286 form thin film 288. Thin film 288 constitutes an interconnect structure. In an alternative embodiment, thin film 288 may include as few as one conductive layer, such as conductive layer 282. In another alternative embodiment, thin film 288 includes two or more RDL layers, such as conductive layers 282 and 286 and additional conductive layers similar to conductive layers 282 and 286. Thin film 288 may include as many insulating and conductive layers as necessary for the interconnect density and electrical routing needed for the particular semiconductor device.

Thin film 288 includes surface 290 over which stacked semiconductor device 262 is disposed and surface 292 opposite surface 290. Thin film 288 has a thickness less than 50 μm, which is thinner than a conventional THV substrate which typically has a thickness of 250 to 350 μm. Thin film 288 is formed from layers of insulating and conductive material which can each be formed with a thickness of less than 10 μm. The thin layers of insulating and conductive material allow horizontal and vertical interconnects to be formed in close proximity to adjacent horizontal and vertical interconnects within the thin layers (e.g., with a pitch of less than 50 μm). With horizontal and vertical interconnects formed in close proximity to adjacent interconnects, a higher density of interconnects is achieved within the interconnect structure. Because thin film 288 includes higher density interconnects, thin film 288 provides more flexibility in integration of semiconductor devices into the 3D semiconductor structure. The high density interconnect structure accommodates semiconductor die with varying bump pitch, for example, semiconductor die from multiple manufacturing sources.

Conductive layers 282 and 286 form horizontal and vertical interconnections or vertical conductive vias 294 through thin film 288. Horizontal and vertical interconnections are formed as close together as necessary for connection to a semiconductor die or component or for routing electrical signals through thin film 288. For example, conductive layers 282 and 286 may include conductive traces. A first conductive trace is formed in close proximity to a second conductive trace (e.g., a pitch between conductive traces is less than 50 μm). The fine pitch between conductive traces allows space for more conductive traces to be formed within thin film 288, while the thinness of each thin film layer reduces the thickness of the interconnect structure compared to a conventional THV substrate.

Conductive layers 282 and 286 also form vertical conductive vias 294 in which a first vertical conductive via is formed in close proximity to a second vertical conductive via (e.g., a pitch between vertical conductive vias is less than 50 μm). Conductive layer 282 includes a first portion of vertical conductive vias 294, and conductive layer 286 includes a second portion of vertical conductive vias 294. Vertical conductive vias 294 may extend from surface 290 to surface 292 of thin film 288 or vertical conductive vias 294 may be formed partially through thin film 288. A pitch P between vertical conductive vias 294 is less than 50 μm. The pitch P between vertical conductive vias 294 in thin film 288 is finer than the pitch between conductive vias in a conventional THV substrate, which is typically 100 μm or greater.

The fine pitch horizontal and vertical interconnections in thin film 288 provides a higher interconnect density and I/O terminal count. Thin film 288 provides an interconnect pitch which allows high density semiconductor die to be mounted to thin film 288 in a flipchip orientation. Additional semiconductor die can be mounted in a face-to-back orientation over thin film 288. Thin film 288 extends beyond a footprint of semiconductor die 228 in a fan-out design to further increase the I/O terminal count. The thinness of thin film 288 allows for a smaller and thinner overall semiconductor device package, which reduces warpage and increase the speed of the device. Further, the high density interconnects accommodates more electrical signals per 3D semiconductor structure and improves the compatibility of the interconnect structure with a greater variety of semiconductor device and components types.

In FIG. 5l, an optional insulating or passivation layer 296 is formed over insulating layer 284 and conductive layer 286. Insulating layer 296 contains one or more layers of low temperature curable polymer dielectric resist (i.e., cures at less than 260 degrees C.) with or without filler, SiO2, Si3N4, SiON, Ta2O5, Al2O3, or other material having similar insulating and structural properties. Insulating layer 296 is deposited using PVD, CVD, printing, spin coating, spray coating, sintering, thermal oxidation, or other suitable process. A portion of insulating layer 296 is removed by an exposure or development process, LDA, etching, or other suitable process to form openings in the insulating layer, which expose portions of conductive layer 286 for subsequent electrical interconnection.

FIG. 5l also shows an electrically conductive bump material deposited over conductive layer 286, within the openings in insulating layer 296. Bumps 298 are formed over conductive layer 296. Alternatively, if thin film 288 includes one RDL layer, such as conductive layer 282, bumps 298 are formed over the single RDL layer. Bumps 298 can be formed over conductive layer 282 or 284 or an additional conductive layer. Bumps 298 are formed over the area of thin film 288 outside a footprint of stacked semiconductor device 262. Bumps 298 can also be formed in the area of thin film 288 directly underneath stacked semiconductor device 262. In one embodiment, bumps 298 are formed within a footprint of stacked semiconductor device 262 and overlap with the footprint of stacked semiconductor device 262.

Bumps 298 are formed using evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 286 using a suitable attachment or bonding process. In one embodiment, the bump material is reflowed by heating the material above its melting point to form spherical balls or bumps 298. In some applications, bumps 298 are reflowed a second time to improve electrical contact to conductive layer 286. In one embodiment, bumps 298 are formed over a UBM having a wetting layer, barrier layer, and adhesive layer. The bumps can also be compression bonded to conductive layer 286. Bumps 298 represent one type of interconnect structure that can be formed over conductive layer 286. The interconnect structure can also use bond wires, conductive paste, stud bump, micro bump, or other electrical interconnect.

Taken together, insulating layers 280, 284, and 296 as well as conductive layers 282, 286, and conductive bumps 298 form interconnect structure 300. The number of insulating and conductive layers included within interconnect structure 300 depends on, and varies with, the complexity of the circuit routing design. Accordingly, interconnect structure 300 can include one or more insulating and conductive layers to facilitate electrical interconnect with respect to stacked semiconductor device 262. Elements that would otherwise be included in a backside interconnect structure or RDL can be integrated as part of interconnect structure 300 to simplify manufacturing and reduce fabrication costs with respect to a package including both front side and backside interconnects or RDLs.

In FIG. 5m, composite substrate or reconstituted wafer 268 is singulated with saw blade or laser cutting device 302 into individual semiconductor devices 304.

FIG. 5n shows an individual semiconductor device 304 after singulation. Semiconductor device 304 is a 3D semiconductor structure with stacked semiconductor die disposed on thin film 288 of interconnect structure 300. Semiconductor die 228 and semiconductor die 240 are electrically connected to vertical conductive vias 294. Semiconductor die 240 is electrically connected to vertical conductive vias 294 through conductive layers 246 and 248, conductive bumps 250, and vias 236 of semiconductor die 228. Semiconductor die 228 and 240 electrically connect to external devices through vertical conductive vias 294. Semiconductor device 304 including fine pitch vertical conductive vias 294 accommodates high density semiconductor die, such as wide I/O memory devices, in a flipchip orientation over a TSV semiconductor die. Semiconductor device 304 also accommodates mixed semiconductor die sizes. For example, a semiconductor die having memory function and an application processor die can be integrated face-to-back into semiconductor device 304.

Semiconductor device 304 provides vertical drop-down routing of electrical signals for semiconductor die 228 and 240 through the fine pitch vertical conductive vias 294 in thin film 288 of interconnect structure 300. The electrical conduction path length between stacked semiconductor device 262 and external devices is reduced to 300 μm or less which results in a higher speed and more efficient device. The thermal path length is also reduced. Thin film 288 reduces the overall package height of semiconductor device 304. The thickness of semiconductor device 304 is 0.5 mm or less, and is typically as thin as 0.2 mm, whereas the package thickness using a conventional THV substrate is 0.7 to 1.4 mm. The smaller package profile of semiconductor device 304 improves the thermal performance of the semiconductor device by reducing warpage and providing a shorter thermal path. The smaller package profile of semiconductor device 304 with thin film layers reduces the parasitic capacitance of the 3D semiconductor structure.

Figure 6A:
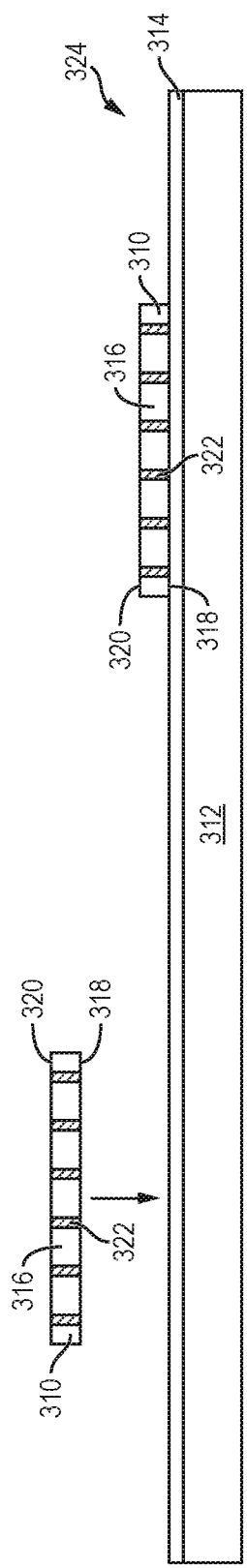
FIGS. 6a-6g illustrate an alternative embodiment of the process of forming a Fo-eWLB.

FIGS. 6a-6g illustrate an alternative embodiment of the process of forming a Fo-eWLB over which a thin film interconnect structure can be formed having fine pitch interconnects. FIG. 6a shows a TSV semiconductor die 310 mounted to carrier or temporary substrate 312. Carrier 312 contains a sacrificial base material such as silicon, polymer, beryllium oxide, glass, or other suitable low-cost, rigid material for structural support. An interface layer or double-sided tape 314 is formed over carrier 312 as a temporary adhesive bonding film, etch-stop layer, or thermal release layer.

Semiconductor die 310 includes a base substrate material 316, such as silicon, germanium, gallium arsenide, indium phosphide, or silicon carbide for structural support. Semiconductor die 310 include active surface 318 and back surface 320 opposite active surface 318. Active surface 318 is oriented toward carrier 312. Active surface 318 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 318 to implement analog circuits or digital circuits, such as DSP, ASIC, memory, application processor, or other signal processing circuit. Semiconductor die 310 may include discrete devices. Discrete devices can be active devices, such as transistors and diodes, or passive devices, such as capacitors, resistors, and inductors for RF signal processing. Semiconductor die 310 may also include a packaged semiconductor die.

A plurality of vias 322 is formed through substrate 226 using mechanical drilling, laser drilling, or deep reactive ion etching (DRIE). Vias 322 extend through substrate 316. Vias 322 are filled with Al, Cu, Sn, Ni, Au, Ag, Ti, tungsten (W), poly-silicon, or other suitable electrically conductive material using electrolytic plating, electroless plating process, or other suitable metal deposition process to form vertical z-direction conductive TSV. Semiconductor die 310 disposed over interface layer 314 and carrier 312 constitutes composite substrate or reconstituted wafer 324.

Figure 6B:
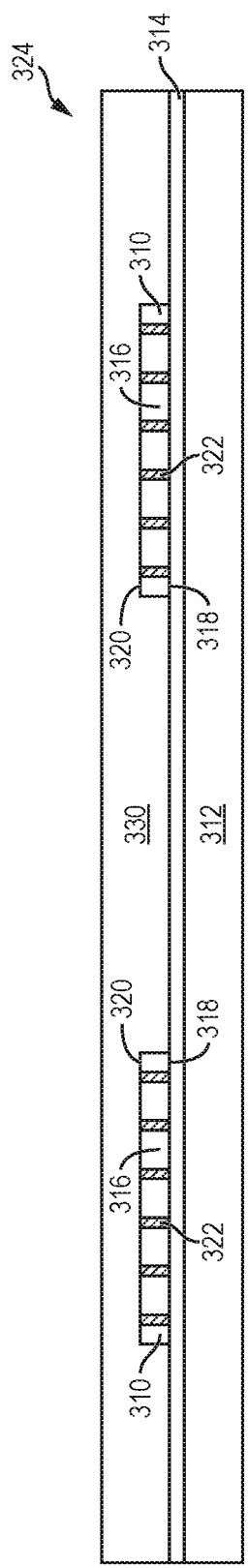

In FIG. 6b, an encapsulant or molding compound 330 deposited over interface layer 314 and carrier 312 and over and around semiconductor die 310 using a paste printing, compressive molding, transfer molding, liquid encapsulant molding, vacuum lamination, film-assisted molding, or other suitable applicator. Encapsulant 330 is formed over back surface 320 of semiconductor die 310, and can be thinned in a subsequent backgrinding step. Encapsulant 330 can also be deposited such that the encapsulant is coplanar with back surface 320, and does not cover back surface 320. Encapsulant 330 can be polymer composite material, such as epoxy resin with filler, epoxy acrylate with filler, or polymer with proper filler. Encapsulant 330 is non-conductive, provides physical support, and environmentally protects the semiconductor device from external elements and contaminants.

Figure 6C:
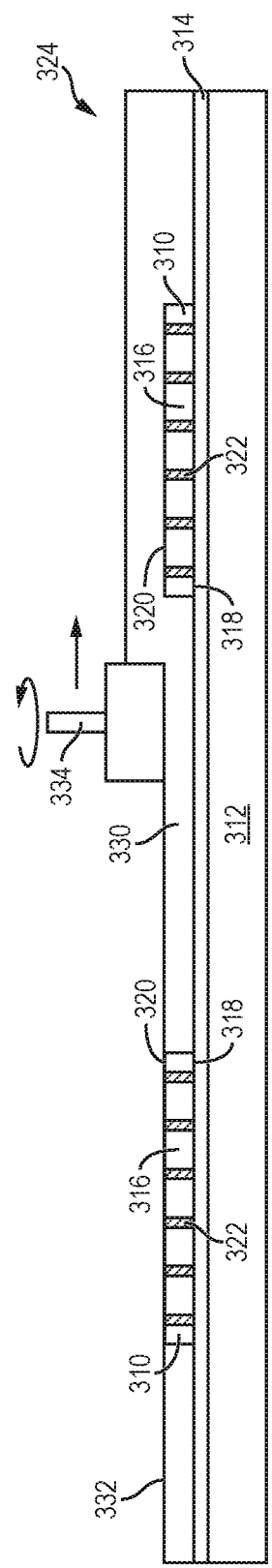

FIG. 6c shows composite substrate or reconstituted wafer 324 covered by encapsulant 330. In FIG. 6c, surface 332 of encapsulant 330 undergoes an optional grinding operation with grinder 334 to planarize the surface and reduce thickness of the encapsulant. A chemical etch can also be used to remove and planarize encapsulant 330. FIG. 6c shows a portion of encapsulant 330 removed to expose back surface 320 of semiconductor die 310.

Figure 6D:
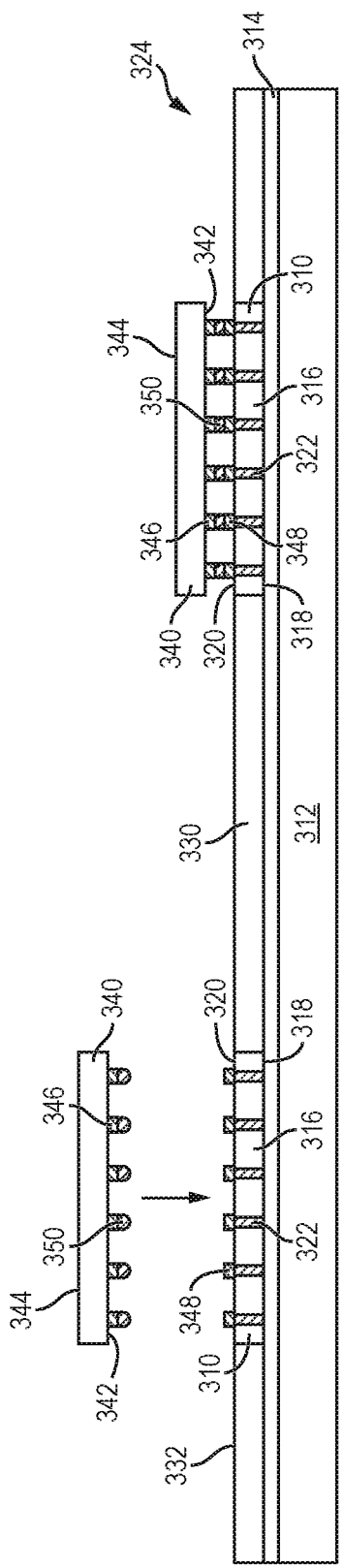

In FIG. 6d, semiconductor die or components 340 is mounted over semiconductor die 310. Semiconductor die 340 includes active surface 342 and back surface 344. Active surface 342 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 342 to implement analog circuits or digital circuits, such as DSP, ASIC, memory, application processor, or other signal processing circuit. Semiconductor die 340 may include discrete devices. Discrete devices can be active devices, such as transistors and diodes, or passive devices, such as capacitors, resistors, and inductors for RF signal processing. Semiconductor die 340 may also include a packaged semiconductor die. In one embodiment, semiconductor die 310 includes an application processor and semiconductor die 340 includes memory. In another embodiment, semiconductor die 310 includes memory, and semiconductor die 340 includes an application processor. Alternatively, semiconductor die 310 and 340 include other signal processing circuits, discrete devices, components, or packaged devices.

Semiconductor die 340 is disposed over semiconductor die 228 with active surface 342 oriented toward back surface 320 of semiconductor die 310. A conductive layer 346 is formed over active surface 342 of semiconductor die 340. Conductive layer 346 is formed using a metal deposition process such as Cu foil lamination, printing, PVD, CVD, sputtering, electrolytic plating, and electroless plating. Conductive layer 346 can be one or more layers of Al, Cu, Sn, Ni, Au, Ag, Ti, W, or other suitable electrically conductive material.

A conductive layer 348 is formed over back surface 320 of semiconductor die 310. Conductive layer 348 is formed using a metal deposition process such as Cu foil lamination, printing, PVD, CVD, sputtering, electrolytic plating, and electroless plating. Conductive layer 348 can be one or more layers of Al, Cu, Sn, Ni, Au, Ag, Ti, W, or other suitable electrically conductive material. Conductive layer 348 contacts or is electrically connected to vias 322.

An electrically conductive bump material is deposited over conductive layer 346 or conductive layer 348 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 346 and 348 using a suitable attachment or bonding process. In one embodiment, the bump material is reflowed by heating the material above its melting point to form balls or bumps 350. In some applications, bumps 350 are reflowed a second time to improve electrical contact to conductive layer 346 and 348. Bumps 350 can also be compression bonded or thermocompression bonded to conductive layer 346 and 348. Bumps 350 represent one type of interconnect structure that can be formed over conductive layer 346 and 348. The interconnect structure can also use stud bump, micro bump, or other electrical interconnect.

An optional encapsulant or molding compound, not shown in FIGS. 6a-6g, can be deposited over and around semiconductor die 340 using a paste printing, compressive molding, transfer molding, liquid encapsulant molding, vacuum lamination, film-assisted molding, or other suitable applicator. The optional encapsulant is similar to encapsulant 330 and can be formed over back surface 344 of semiconductor die 340 and over semiconductor die 310 and encapsulant 330.

Figure 6E:
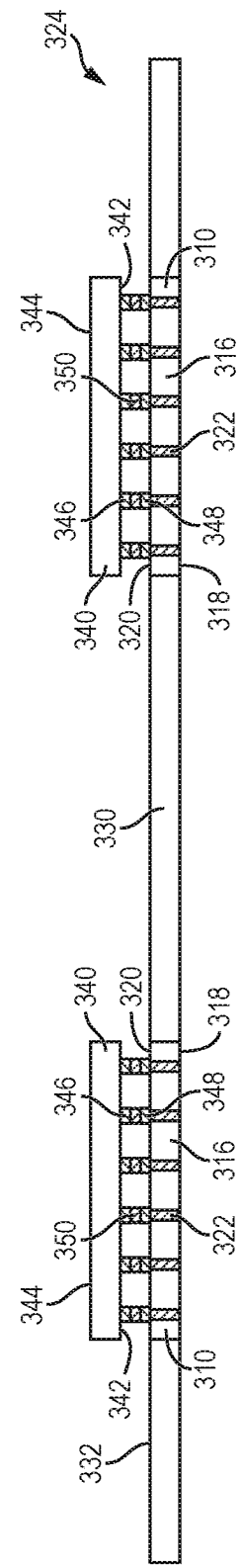

In FIG. 6e, carrier 312 and interface layer 314 are removed from composite substrate 324 by chemical etching, mechanical peeling, CMP, mechanical grinding, thermal bake, UV light, laser scanning, or wet stripping to facilitate the formation of an interconnect structure over active surface 318 of semiconductor die 310 and encapsulant 330 around a periphery of the semiconductor die.

Figure 6F:
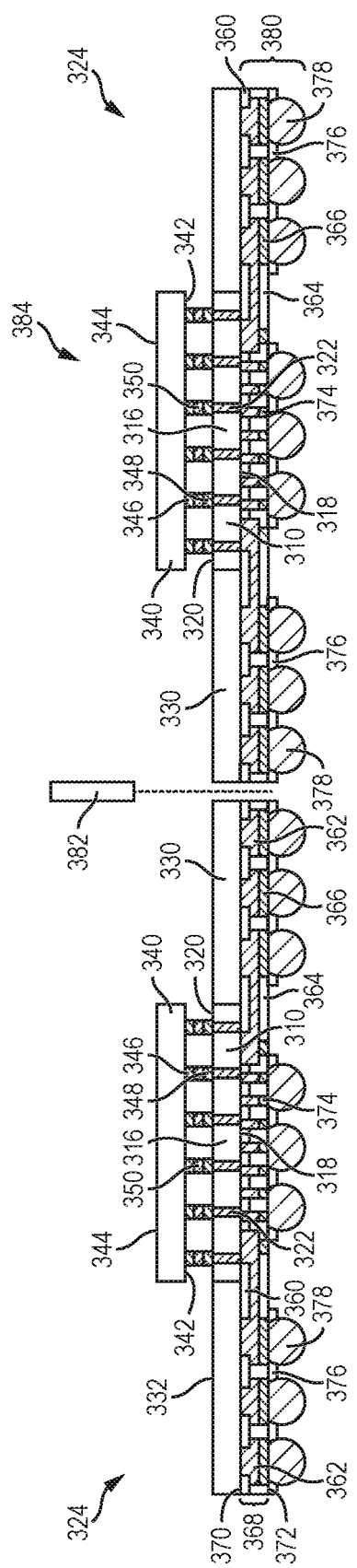

The process of forming a thin film interconnect structure over the surface of composite substrate 324 in FIG. 6e proceeds as shown in FIGS. 5h-5l to produce composite substrate 324 including a thin film interconnect structure as shown in FIG. 6f.

In FIG. 6f, an insulating or passivation layer 360 is similar to insulating layer 280 and is formed over semiconductor die 310 and encapsulant 330. Insulating layer 360 has a thickness of less than 10 μm and is typically as thin as 4 μm. A portion of insulating layer 360 is removed by an exposure or development process, LDA, etching, or other suitable process to form openings over active surface 318. The openings expose portions of active surface 318 of semiconductor die 310 and vias 322 for subsequent electrical interconnect.

An electrically conductive layer 362 is similar to conductive layer 282 and is deposited over insulating layer 360, over semiconductor die 310, and disposed within the openings in insulating layer 280 to fill the openings and contact active surface 318 and vias 322. Conductive layer 362 has a thickness of less than 15 μm and is typically as thin as 3 μm. Conductive layer 362 operates as an RDL to fan-out and extend electrical connection from semiconductor die 310 and 340 to points external to semiconductor die 310 and 340. One portion of conductive layer 362 is electrically connected to contact pads on active surface 318 of semiconductor die 310. Another portion of conductive layer 362 is electrically connected to vias 322. Other portions of conductive layer 362 can be electrically common or electrically isolated depending on the design and function of semiconductor die 310 and 340.

An insulating layer or passivation layer 364 is similar to insulating layer 284 and is formed over insulating layer 360 and conductive layer 362. Insulating layer 364 has a thickness of less than 10 μm and is typically as thin as 4 μm. A portion of insulating layer 364 is removed by an exposure or development process, LDA, etching, or other suitable process to form openings in the insulating layer, which expose portions of conductive layer 362 for subsequent electrical interconnection.

An electrically conductive layer 366 is similar to conductive layer 286 and is deposited over insulating layer 364, over conductive layer 362, and disposed within the openings in insulating layer 364 as one or more layers, including seed layers, to fill the openings and contact and electrically connect to conductive layer 362. Conductive layer 366 has a thickness of less than 15 μm and is typically as thin as 3 μm. In one embodiment, the deposition of conductive layer 366 includes selective plating with a seed layer and lithography. Conductive layer 366 operates as an RDL to fan-out and extend electrical connection from semiconductor die 310 and 340 to points external to semiconductor die 310 and 340.

Insulating layers 360 and 364 together with conductive layers 362 and 366 form thin film 368 which is similar to thin film 288. Thin film 368 constitutes an interconnect structure. In an alternative embodiment, thin film 368 may include as few as one conductive layer, such as conductive layer 362. Thin film 368 may include as many insulating and conductive layers as necessary for the interconnect density and electrical routing needed for the particular semiconductor device.

Thin film 368 includes surface 370 over which semiconductor die 310 and 340 are disposed and surface 372 opposite surface 370. Thin film 368 has a thickness less than 50 μm, which is thinner than a conventional THV substrate which typically has a thickness of 250 to 350 μm. Thin film 368 is formed from layers of insulating and conductive material which can each be formed with a thickness of less than 10 μm. The thin layers of insulating and conductive material allow horizontal and vertical interconnects to be formed in close proximity to adjacent horizontal and vertical interconnects within the thin layers (e.g., with a pitch of less than 50 μm). With horizontal and vertical interconnects formed in close proximity to adjacent interconnects, a higher density of interconnects is achieved within the interconnect structure. Because thin film 368 includes higher density interconnects, thin film 368 provides more flexibility in integration of semiconductor devices into the 3D semiconductor structure. The high density interconnect structure accommodates semiconductor die with varying bump pitch, for example, semiconductor die from multiple manufacturing sources.

Conductive layers 362 and 366 form horizontal and vertical interconnections or vertical conductive vias 374 through thin film 368. Horizontal and vertical interconnections are formed as close together as necessary for connection to a semiconductor die or component or for routing electrical signals through thin film 368. For example, conductive layers 362 and 366 may include conductive traces. A first conductive trace is formed in close proximity to a second conductive trace (e.g., a pitch between conductive traces is less than 50 µm). The fine pitch between conductive traces allows space for more conductive traces to be formed within thin film 368, while the thinness of each thin film layer reduces the thickness of the interconnect structure compared to a conventional THV substrate.

Conductive layers 362 and 366 also form vertical conductive vias 374 in which a first vertical conductive via is formed in close proximity to a second vertical conductive via (e.g., a pitch between vertical conductive vias is less than 50 µm). Conductive layer 362 includes a first portion of vertical conductive vias 374, and conductive layer 366 includes a second portion of vertical conductive vias 374. Vertical conductive vias 374 may extend from surface 370 to surface 372 of thin film 368 or vertical conductive vias 374 may be formed partially through thin film 368. A pitch between vertical conductive vias 374 is less than 50 µm. The pitch between vertical conductive vias 374 in thin film 368 is finer than the pitch between conductive vias in a conventional THV substrate, which is typically 100 µm or greater.

The fine pitch horizontal and vertical interconnections in thin film 368 provides a higher interconnect density and I/O terminal count. Thin film 368 provides an interconnect pitch which allows high density semiconductor die to be mounted to thin film 368 in a flipchip orientation. Additional semiconductor die can be mounted in a face-to-back orientation over thin film 368. Thin film 368 extends beyond a footprint of semiconductor die 310 and 340 in a fan-out design to further increase the I/O terminal count. The thinness of thin film 368 allows for a smaller and thinner overall semiconductor device package, which reduces warpage and increases the speed of the device. Further, the high density interconnects accommodates more electrical signals per 3D semiconductor structure and improves the compatibility of the interconnect structure with a greater variety of semiconductor device and components types.

An optional insulating or passivation layer 376 is similar to insulating layer 296 and is formed over insulating layer 364 and conductive layer 366. An electrically conductive bump material is deposited over conductive layer 366, within the openings in insulating layer 376. Bumps 378 are formed over conductive layer 366. Alternatively, if thin film 368 includes one RDL layer, such as conductive layer 362, bumps 378 are formed over the single RDL layer. Bumps 378 can be formed over conductive layer 362 or 364 or an additional conductive layer. Bumps 378 are formed over the area of thin film 368 outside a footprint of semiconductor die 310 and 340. Bumps 378 are similar to bumps 298 and can be formed in the area of thin film 368 directly underneath or overlapping with the footprint of semiconductor die 310 and 340. In one embodiment, bumps 378 are formed within a footprint of semiconductor die 310 and 340 and overlap with the footprint of semiconductor die 310 and 340. Bumps 378 represent one type of interconnect structure that can be formed over conductive layer 366. The interconnect structure can also use bond wires, conductive paste, stud bump, micro bump, or other electrical interconnect.

Taken together, insulating layers 360, 364, and 376 as well as conductive layers 362, 366, and conductive bumps 378 form interconnect structure 380. The number of insulating and conductive layers included within interconnect structure 380 depends on, and varies with, the complexity of the circuit routing design. Accordingly, interconnect structure 380 can include one or more insulating and conductive layers to facilitate electrical interconnect with respect to semiconductor die 310 and 340. Elements that would otherwise be included in a backside interconnect structure or RDL can be integrated as part of interconnect structure 380 to simplify manufacturing and reduce fabrication costs with respect to a package including both front side and backside interconnects or RDLs.

Composite substrate or reconstituted wafer 324 is singulated with saw blade or laser cutting device 382 into individual semiconductor devices 384.

Figure 6G:
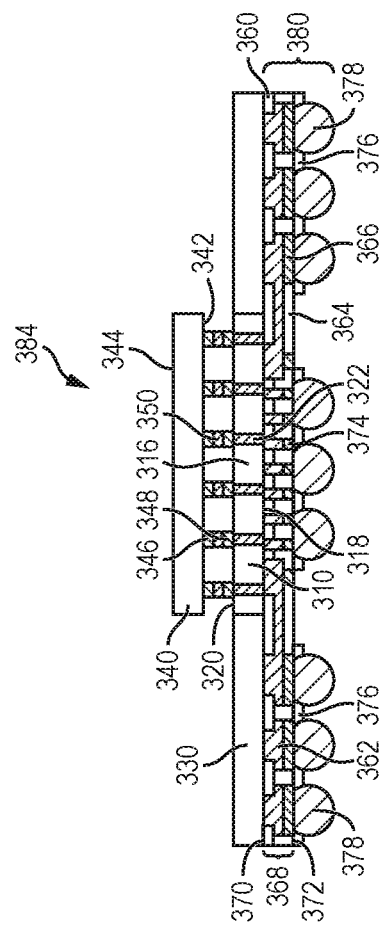

FIG. 6g shows an individual semiconductor device 384 after singulation. Semiconductor device 384 is a 3D semiconductor structure with stacked semiconductor die disposed on thin film 368 of interconnect structure 380. Semiconductor die 310 and semiconductor die 340 are electrically connected to vertical conductive vias 374. Semiconductor die 340 is electrically connected to vertical conductive vias 374 through conductive layers 346 and 348, conductive bumps 350, and vias 322 of semiconductor die 310. Semiconductor die 310 and 340 electrically connect to external devices through vertical conductive vias 374. Semiconductor device 384 including fine pitch vertical conductive vias 374 accommodates high density semiconductor die, such as wide I/O memory devices, in a flipchip orientation over a TSV semiconductor die. Semiconductor device 384 also accommodates mixed semiconductor die sizes. For example, a semiconductor die having memory function and an application processor die can be integrated face-to-back into semiconductor device 384.

Semiconductor device 384 provides vertical drop-down routing of electrical signals for semiconductor die 310 and 340 through the fine pitch vertical conductive vias 374 in thin film 368 of interconnect structure 380. The electrical conduction path length between semiconductor die 310 and 340 and external devices is reduced to 300 µm or less which results in a higher speed and more efficient device. The thermal path length is also reduced. Thin film 368 reduces the overall package height of semiconductor device 384. The thickness of semiconductor device 384 is 0.5 mm or less, and is typically as thin as 0.2 mm, whereas the package thickness using a conventional THV substrate is 0.7 to 1.4 mm. The smaller package profile of semiconductor device 384 improves the thermal performance of the semiconductor device by reducing warpage and providing a shorter thermal path. The smaller package profile of semiconductor device 384 with thin film layers reduces the parasitic capacitance of the 3D semiconductor structure.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die including a plurality of conductive vias formed through the first semiconductor die;
   providing a second semiconductor die including a plurality of contact pads formed over an active surface of the second semiconductor die;
   disposing the second semiconductor die over the first semiconductor die with the contact pads of the second semiconductor die aligned and electrically coupled to the conductive vias of the first semiconductor die;
   depositing an encapsulant over the first semiconductor die and second semiconductor die; and
   forming a thin film interconnect structure over the encapsulant and first semiconductor die, wherein the thin film interconnect structure is electrically coupled to the second semiconductor die through the conductive vias of the first semiconductor die.

2. The method of claim 1, wherein a pitch between the conductive vias is 50 micrometers (μm) or less.

3. The method of claim 1, wherein a thickness of the thin film interconnect structure is 50 micrometers (μm) or less.

4. The method of claim 1, wherein a surface of the encapsulant is coplanar with a surface of the first semiconductor die.

5. The method of claim 4, further including forming the thin film interconnect structure directly on the surface of the encapsulant and the surface of the first semiconductor die.

6. A method of making a semiconductor device, comprising:
   providing a first semiconductor die including a plurality of conductive vias formed through the first semiconductor die;
   providing a second semiconductor die including a plurality of contact pads;
   disposing the second semiconductor die over a first surface of the first semiconductor die, wherein the first surface of the first semiconductor die is oriented toward the second semiconductor die;
   depositing an encapsulant over the first semiconductor die, wherein a surface of the encapsulant is coplanar to a second surface of the first semiconductor die opposite the first surface of the first semiconductor die, wherein the second surface of the first semiconductor die is oriented away from the second semiconductor die, and wherein the first surface of the first semiconductor die is disposed between the second semiconductor die and the second surface of the first semiconductor die; and
   forming a thin film interconnect structure over the encapsulant and the second surface of the first semiconductor die.

7. The method of claim 6, wherein a pitch between the conductive vias is 50 micrometers (μm) or less.

8. The method of claim 6, wherein a thickness of the thin film interconnect structure is 50 micrometers (μm) or less.

9. The method of claim 6, further including depositing the encapsulant over the first semiconductor die and second semiconductor die.

10. The method of claim 6, further including forming the thin film interconnect structure directly on the surface of the encapsulant and the surface of the first semiconductor die.

11. The method of claim 6, further including providing vertical drop-down routing of electrical signals from the contact pads of the second semiconductor die to the conductive vias of the first semiconductor die.

12. A method of making a semiconductor device, comprising:
   providing a first semiconductor die including a plurality of conductive vias formed through the first semiconductor die;
   disposing a second semiconductor die over the first semiconductor die;
   depositing an encapsulant over the first semiconductor die and second semiconductor die, wherein the encapsulant extends over a side surface of the first semiconductor die; and
   forming a thin film interconnect structure over the encapsulant and first semiconductor die.

13. The method of claim 12, wherein a pitch between the conductive vias is 50 micrometers (μm) or less.

14. The method of claim 12, wherein a thickness of the thin film interconnect structure is 50 micrometers (μm) or less.

15. The method of claim 12, wherein a surface of the encapsulant is coplanar with a surface of the first semiconductor die.

16. The method of claim 12, further including forming the thin film interconnect structure directly on the encapsulant and first semiconductor die.

17. The method of claim 12, further including providing vertical drop-down routing of electrical signals from the contact pads of the second semiconductor die to the conductive vias of the first semiconductor die.

18. A semiconductor device, comprising:
   a first semiconductor die including a plurality of conductive vias formed through the first semiconductor die;
   a second semiconductor die including a plurality of contact pads, wherein the second semiconductor die is disposed over the first semiconductor die with the contact pads of the second semiconductor die aligned to the conductive vias of the first semiconductor die;
   an encapsulant disposed over and physically contacting a first surface of the first semiconductor die; and
   a thin film interconnect structure formed over the encapsulant and on a second surface of the first semiconductor die, wherein the second surface of the first semiconductor die is perpendicular to the first surface of the first semiconductor die.

19. The semiconductor device of claim 18, wherein a pitch between the conductive vias is 50 micrometers (μm) or less.

20. The semiconductor device of claim 18, wherein a thickness of the thin film interconnect structure is 50 micrometers (μm) or less.

21. The semiconductor device of claim 18, wherein a surface of the encapsulant is coplanar with the second surface of the first semiconductor die.

22. The semiconductor device of claim 18, wherein the thin film interconnect structure is formed directly on the encapsulant and first semiconductor die.

23. The semiconductor device of claim 18, wherein the first semiconductor die is disposed between the thin film interconnect structure and the second semiconductor die.

* * * * *